(12) United States Patent
Sampei

(10) Patent No.: US 6,673,508 B2
(45) Date of Patent: Jan. 6, 2004

(54) PLANOGRAPHIC PRINTING PLATE MATERIAL AND METHOD OF PREPARING PLANOGRAPHIC PRINTING PLATE

(75) Inventor: Takeshi Sampei, Hino (JP)

(73) Assignee: Konica Corporation (JP)

(*) Notice: Subject to any disclaimer, the term of this patent is extended or adjusted under 35 U.S.C. 154(b) by 1 day.

(21) Appl. No.: 10/095,935

(22) Filed: Mar. 12, 2002

(65) Prior Publication Data
US 2003/0096188 A1 May 22, 2003

(30) Foreign Application Priority Data
Apr. 3, 2001 (JP) ......................... 2001-104334

(51) Int. Cl.⁷ ............... G03F 7/07; G03F 7/06; G03C 1/295; G03C 1/498; G03C 8/06
(52) U.S. Cl. .......... 430/203; 430/204; 430/230; 430/264; 430/598; 430/619
(58) Field of Search ................ 430/203, 204, 430/230, 264, 598, 619

(56) References Cited
U.S. PATENT DOCUMENTS

| | | | | |
|---|---|---|---|---|
| 4,639,407 A | * | 1/1987 | Aono et al. ............... | 430/230 |
| 4,803,146 A | * | 2/1989 | Inoue et al. ............... | 430/230 |
| 4,876,171 A | * | 10/1989 | Hirai ......................... | 430/203 |
| 5,413,897 A | * | 5/1995 | Van Rompuy et al. ..... | 430/230 |
| 5,541,034 A | * | 7/1996 | Leender et al. ............ | 430/619 |
| 5,705,311 A | * | 1/1998 | Young ....................... | 430/230 |
| 6,232,059 B1 | * | 5/2001 | Yamada et al. ............ | 430/619 |
| 6,306,574 B1 | * | 10/2001 | Yamada et al. ............ | 430/264 |
| 6,309,814 B1 | * | 10/2001 | Ito ............................. | 430/264 |

FOREIGN PATENT DOCUMENTS

JP    11/084669    *    3/1999

OTHER PUBLICATIONS

JPAB abstract of JP11/084669A; Mar. 1999.*
Derwent Abstr. of JP 11/084669, Mar. 1999.*

* cited by examiner

Primary Examiner—Richard L. Schilling
(74) Attorney, Agent, or Firm—Muserlian, Lucas and Mercanti

(57) ABSTRACT

A planographic printing plate material and a method of preparing a planographic printing plate are disclosed, the planographic printing plate material comprising a support and provided thereon, one or more structural layers containing light sensitive silver halide grains, organic silver salt grains, a reducing agent, a contrast-increasing agent and a physical developing nucleus.

6 Claims, 1 Drawing Sheet

PLANOGRAPHIC PRINTING PLATE MATERIAL AND METHOD OF PREPARING PLANOGRAPHIC PRINTING PLATE

FIELD OF THE INVENTION

The present invention relates to a planographic printing plate material to which a photothermographic material employing an organic silver salt is applied, and a method of preparing a printing plate therefrom.

BACKGROUND OF THE INVENTION

A method of preparing a printing plate is known which comprises the steps of exposing a planographic printing plate material without an original and developing the exposed material. Of these, a planographic printing plate material prepared according to a silver complex diffusion transfer process (DTR) is well known, in which silver images formed are employed as ink receptive portions. There are, for example, a planographic printing plate material comprising a support and provided thereon, a silver halide emulsion layer, and a physical developing nucleus layer in that order as disclosed in Japanese Patent Publication No. 48-30562, and Japanese Patent O.P.I. Publication Nos. 53-9603, 53-21602, 54-103104 and 56-9750, and a planographic printing plate material comprising an aluminum plate having thereon a physical developing nucleus layer and a silver halide emulsion layer on the nucleus layer as disclosed in Japanese Patent O.P.I. Publication Nos. 5-216236, and 6-81194.

However, these planographic printing plate materials are processed with a liquid such as a developing solution, which produces waste liquid, and disposal of the waste liquid is time-consuming and increases cost. There is, further, the problem that a processor used stains.

As a method in which liquid waste is not produced, there is a method as disclosed in Japanese Patent O.P.I. Publication No. 11-84669 in which thermal development is carried out without employing a developing solution. Such a thermal development has defects in that provide poor printing reproduction of images such as small dots or thin lines.

SUMMARY OF THE INVENTION

In view of the above, the present invention has been made. An object of the invention is to provide a planographic printing plate material employing a thermal development process without producing a liquid waste, and providing excellent printing reproduction and a preparing method thereof.

DETAILED DESCRIPTION OF THE INVENTION

Figure 1:
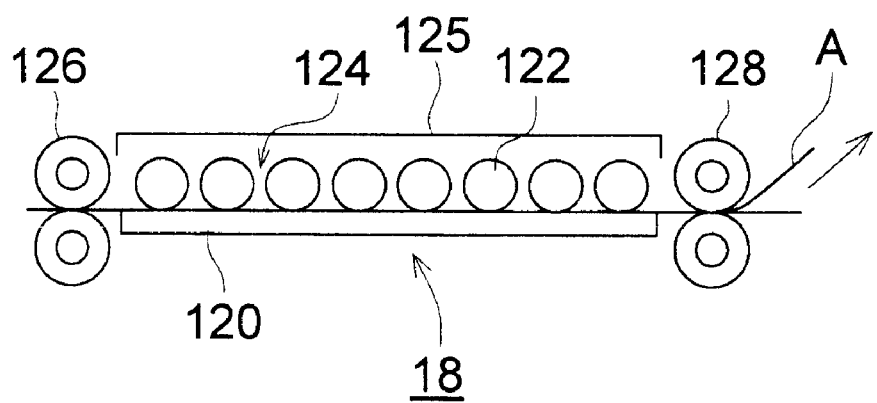
FIG. 1 shows an illustration of an automatic thermal developing machine.

The above object of the invention has been attained by the following constitution:

1. A planographic printing plate material comprising a support and provided thereon, one or more structural layers containing light sensitive silver halide grains, organic silver salt grains, a reducing agent, a contrast-increasing agent and a physical developing nucleus.

2. The planographic printing plate material of item 1, wherein the contrast-increasing agent is a vinyl compound represented by the following formula (G):

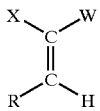

formula (G)

wherein X represents an electron withdrawing group; W represents a hydrogen atom, an alkyl group, an alkenyl group, an alkynyl group, an aryl group, a heterocyclic group, a halogen atom, an acyl group, a thioacyl group, an oxalyl group, an oxyoxalyl group, a thiooxalyl group, an oxamoyl group, an oxycarbonyl group, a thiocarbonyl group, a carbamoyl group, a thiocarbmoyl group, a sulfonyl group, a sulfinyl group, an oxysulfonyl group, a thiosulfonyl group, a sulfamoyl group, an oxysulfinyl group, a thiosulfinyl group, a sulfinamoyl group, a phosphoryl group, a nitro group, an imino group, an N-carbonylimino group, an N-sulfonylimino group, a dicyanoethyl group, an ammonium group, a sulfonium group, a phosphonium group, a pyrylium group, or an immonium group; and R represents a halogen atom, a hydroxyl group, an alkoxy group, an aryloxy group, a heterocyclic-oxy group, an alkenyloxy group, an acyloxy group, an alkoxycarbonyloxy group, an aminocarbonyloxy group, a mercapto group, an alkylthio group, an arylthio group, a heterocyclic-thio group, an alkenylthio group, an acylthio group, an alkoxycarbonylthio group, an aminocarbonylthio group, an organic or inorganic salt group of a hydroxyl or mercapto group, an amino group, an alkylamino group, a cyclic amino group, an acylamino group, an oxycarbonylamino group, a heterocyclic group, a ureido group, or a sulfonamido group.

3. The planographic printing plate material of item 1, wherein the contrast-increasing agent is a hydrazine derivative.

4. The planographic printing plate material of item 1, wherein the average grain size of the light sensitive silver halide grains is in the range of from 0.01 to 0.1 μm.

5. The planographic printing plate material of item 1, wherein one of the structural layers contains light sensitive silver halide grains, organic silver salt grains, a reducing agent, a contrast-increasing agent and a physical developing nucleus.

6. The planographic printing plate material of item 1, wherein the structural layers comprise a physical developing nucleus layer containing the physical developing nucleus, and a light sensitive silver halide layer containing the light sensitive silver halide grains.

7. The planographic printing plate material of item 6, wherein the physical developing nucleus layer is provided on the light sensitive silver halide layer.

8. The planographic printing plate material of item 6, wherein the physical developing nucleus layer is provided between the support and the light sensitive silver halide layer.

11. A planographic printing plate material comprising a support and provided thereon, a layer containing light sensitive silver halide grains, organic silver salt grains, a reducing agent, a contrast-increasing agent and a physical developing nucleus.

12. The planographic printing plate material of item 11, wherein the contrast-increasing agent is a vinyl compound.

13. The planographic printing plate material of item 11, wherein the contrast-increasing agent is a hydrazine derivative.

14. The planographic printing plate material of any one of items 11 through 13, wherein the average grain size of the light sensitive silver halide grains is in the range of from 0.01 to 0.1 μm.

15. A method of preparing a planographic printing plate, wherein the method comprises the steps of imagewise exposing the planographic printing plate material of any one of items 11 through 14, and thermally developing the exposed material.

The present invention will be detailed below.

The present invention is a planographic printing plate material comprising a support and provided thereon, one or more structural layers containing light sensitive silver halide grains, organic silver salt grains, a reducing agent, a contrast-increasing agent and a physical developing nucleus. The light sensitive silver halide grains, the organic silver salt grains, the reducing agent, the contrast-increasing agent and the physical developing nucleus may be contained in the same structural layer or in the different structural layers, separately. The contrast-increasing agent used in the invention is not specifically limited, but preferably is a vinyl compound or a hydrazine derivative.

The vinyl compound in the invention is preferably a compound represented by the following formula (G):

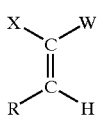

formula (G)

In formula (G), X and R may be either in cis-form or in trans-form. The structure of its exemplary compounds is also similarly included.

In formula (G), X is an electron withdrawing group; W is a hydrogen atom, an alkyl group, an alkenyl group, an alkynyl group, an aryl group, a heterocyclic group, a halogen atom, an acyl group, a thioacyl group, an oxalyl group, an oxyoxalyl group, a thiooxalyl group, an oxamoyl group, an oxycarbonyl group, a thiocarbonyl group, a carbamoyl group, a thiocarbmoyl group, a sulfonyl group, a sulfinyl group, an oxysulfonyl group, a thiosulfonyl group, a sulfamoyl group, an oxysulfinyl group, a thiosulfinyl group, a sulfinamoyl group, a phosphoryl group, a nitro group, an imino group, an N-carbonylimino group, an N-sulfonylimino group, a dicyanoethyl group, an ammonium group, a sulfonium group, a phosphonium group, a pyrylium group, or an immonium group.

R is a halogen atom, a hydroxyl group, an alkoxy group, an aryloxy group, a heterocyclic-oxy group, an alkenyloxy group, an acyloxy group, an alkoxycarbonyloxy group, an aminocarbonyloxy group, a mercapto group, an alkylthio group, an arylthio group, a heterocyclic-thio group, an alkenylthio group, an acylthio group, an alkoxycarbonylthio group, an aminocarbonylthio group, an organic or inorganic salt group of a hydroxyl or mercapto group (e.g., a sodium salt, potassium salt, or silver salt group, etc.), an amino group, an alkylamino group, a cyclic amino group (e.g., pyrrolidino), an acylamino group, an oxycarbonylamino group, a heterocyclic group (a 5- or 6-membered nitrogen containing heterocyclic group such as benzotriazolyl, imidazolyl, triazolyl, or tetrazolyl), a ureido group, or a sulfonamido group. X and W, or X and R may combine together with each other to form a ring. Examples of the ring formed by X and W include pyrazolone, pyrazolidinone, cyclopentadione, β-ketolactone, and β-ketolactam.

In formula (G), the electron withdrawing group represented by X refers to a substituent group exhibiting a negative Hammett's substituent constant σp. Examples thereof include a substituted alkyl group (e.g., halogen-substituted alkyl, etc.), a substituted alkenyl group (e.g., cyanoalkenyl, etc.), a substituted or unsubstituted alkynyl group (e.g., trifluoromethylacetylenyl, cyanoacetylenyl, etc.), a substituted aryl group (e.g., cyanophenyl), a substituted or unsubstituted heterocyclic group (e.g., pyridyl, triazyl, benzoxazolyl, etc.), a halogen atom, a cyano group, an acyl group (e.g., acetyl, trifluoroacetyl, formyl, etc.), a thioacetyl group (e.g., thioacetyl, thioformyl, etc.), an oxalyl group (e.g., methyloxalyl, etc.), an oxyoxalyl group (e.g., ethoxalyl, etc.), a thiooxalyl group (e.g., ethylthiooxalyl, etc.), an oxamoyl group (e.g., methyloxamoyl, etc.), an oxycarbonyl group (e.g., ethoxycarbonyl, etc.), a carboxyl group, a thiocarbonyl group (e.g., ethylthiocarbonyl, etc.), a carbamoyl group, a thiocarbamoyl group, a sulfonyl group, a sulfinyl group, an oxysulfonyl group (e.g., ethoxysulfonyl), a thiosulfonyl group (e.g., ethylthiosulfonyl, etc.), a sulfamoyl group, an oxysulfinyl group (e.g., methoxysulfinyl, etc.), a thiosulfinyl group (e.g., methylthiosulfinyl, etc.), a sulfinamoyl group, a phosphoryl group, a nitro group, an imino group, an N-carbonylimino group (e.g., N-acetylimino, etc.), an N-sulfonylimino group (e.g., N-methanesufonylimono, etc.), a dicynoethyl group, an ammonium group, a sulfonium group, a phophonium group, a pyrilium group and an immonium group, and further including a group of a heterocyclic ring formed by an ammonium group, a sulfonium group, a phosphonium group or an immonium group. Of these groups, groups exhibiting σp of 0.3 or more are specifically preferred.

Examples of the alkyl group represented by W include methyl, ethyl and trifluoromethyl; examples of the alkenyl group include vinyl, halogen-substituted vinyl and cyanovinyl; examples of the alkynyl group include acetylenyl or cyanoacetylenyl; examples of the aryl group include nitrophenyl, cyanophenyl, and pentafluorophenyl; and examples of the heterocyclic group include pyridyl, pyrimidyl, triazinyl, succinimido, tetrazolyl, triazolyl, imidazolyl, and benzoxazolyl. The group, as W, exhibiting positive σp is preferred and the group exhibiting σp of 0.3 or more is specifically preferred.

Of the groups represented by R, a hydroxyl group, a mercapto group, an alkoxy group, an alkylthio group, a halogen atom, an organic or inorganic salt of a hydroxyl or mercapto group and a heterocyclic group are preferred, and a hydroxy group, a mercapto group and an organic or inorganic salt of a hydroxy or mercapto group are more preferred.

Of the groups of X and W, the group having a thioether bond is preferred.

Exemplary examples of the compounds represented by formula (G) are shown below, but are not limited to these.

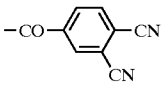
| X | W | | | | | | | |
|---|---|---|---|---|---|---|---|---|
| | —COCH$_3$ | —COCF$_3$ | 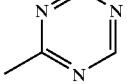 | —CHO | —COCH$_2$SCH$_3$ | —COCOCH$_3$ | —COCOOC$_2$H$_5$ | —COCOSC$_2$H$_5$ |
| —COOC$_2$H$_5$ | 1-1 | 2-1 | 3-1 | 4-1 | 5-1 | 6-1 | 7-1 | 8-1 |
| —COCF$_3$ | 1-2 | 2-2 | 3-2 | 4-2 | 5-2 | 6-2 | — | 8-2 |
| —SO$_2$CH$_3$ | 1-3 | 2-3 | 3-3 | 4-3 | 5-3 | 6-3 | 7-2 | 8-3 |
| —CHO | 1-4 | — | 3-4 | 4-4 | 5-4 | 6-4 | — | 8-4 |
| 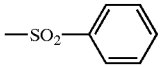 | 1-5 | 2-4 | 3-5 | 4-5 | 5-5 | 6-5 | 7-3 | 8-5 |
| —COOCH$_2$CH$_2$SCH$_3$ | 1-6 | 2-5 | 3-6 | 4-6 | 5-6 | 6-6 | 7-4 | 8-6 |
| —SO$_2$—C$_6$H$_5$ | — | — | — | — | — | 6-7 | 7-5 | — |
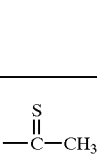
| X | W | | | | | | |
|---|---|---|---|---|---|---|---|
| | —COCONHC$_2$H$_4$SCH$_3$ | 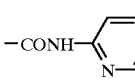 | —COOC$_2$H$_5$ | —COSC$_2$H$_5$ | 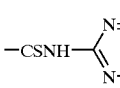 | 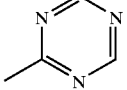 | —SO$_2$CH$_3$ |
| —COOC$_2$H$_5$ | 9-1 | 10-1 | 11-1 | 12-1 | 13-1 | 14-1 | 15-1 |
| —COCF$_3$ | — | 10-2 | — | 12-2 | 13-2 | 14-2 | — |
| —SO$_2$CH$_3$ | 9-2 | 10-3 | 11-2 | 12-3 | 13-3 | 14-3 | 15-2 |
| —SO$_2$CF$_3$ | — | — | — | — | 13-4 | 14-4 | 15-3 |
| —CHO | — | 10-4 | — | 12-4 | 13-5 | 14-5 | — |
| 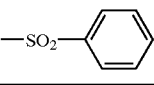 | 9-3 | 10-5 | 11-3 | 12-5 | 13-6 | 14-6 | 15-4 |
| —COOC$_2$H$_4$SCH$_3$ | 9-4 | 10-6 | 11-4 | 12-6 | 13-7 | 14-7 | 15-5 |
| —SO$_2$—C$_6$H$_5$ | — | — | 11-5 | — | | | |

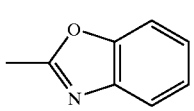
| X | W | | | | |
|---|---|---|---|---|---|
| | —SO$_2$CF$_3$ | —SOCH$_3$ | —SO$_2$OCH$_3$ | —SO$_2$SCH$_3$ | —SO$_2$NH$_2$ |
| —COOC$_2$H$_5$ | — | 17-1 | 18-1 | 19-1 | 20-1 |
| —COCF$_3$ | — | 17-2 | 18-2 | 19-2 | 20-2 |
| —SO$_2$CH$_3$ | — | 17-3 | 18-3 | 19-3 | 20-3 |
| —CHO | — | 17-4 | 18-4 | 19-4 | 20-4 |
| (benzoxazolyl) | 16-1 | 17-5 | 18-5 | 19-5 | 20-5 |
| —COOCH$_2$CH$_2$SCH$_3$ | — | 17-6 | 18-6 | 19-6 | 20-6 |
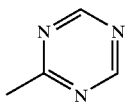
| X | W | | | | |
|---|---|---|---|---|---|
| | —S(O)OCH$_3$ | —S(O)SC$_2$H$_5$ | —S(O)NHCH$_3$ | —P(O)(OC$_2$H$_5$)OC$_2$H$_5$ | —NO$_2$ |
| —COOCF$_2$CF$_2$H | 21-1 | 22-1 | 23-1 | 24-1 | 25-1 |
| —COCF$_3$ | 21-2 | 22-2 | 23-2 | 24-2 | 25-2 |
| —SO$_2$CH$_3$ | 21-3 | 22-3 | 23-3 | 24-3 | 25-3 |
| —CHO | 21-4 | 22-4 | 23-4 | 24-4 | 25-4 |
| —COCH$_2$SCH$_3$ | 21-5 | 22-5 | 23-5 | 24-5 | 25-5 |
| (triazinyl) | 21-6 | 22-6 | 23-6 | 24-6 | 25-6 |
| —COOCH$_2$CH$_2$SCH$_3$ | 21-7 | 22-7 | 23-7 | 24-7 | 25-7 |

$$\begin{array}{c} X\diagdown\quad\diagup W \\ C \\ \parallel \\ C \\ HO\diagup\quad\diagdown H \end{array}$$

| X | W | | | | |
|---|---|---|---|---|---|
| | Ph-N=C(CH₃)- | CH₃OC(=O)-N=C(CH₃)- | OHC-N=CH- | CF₃OC(=O)-N=C(CF₃)- | CH₃SO₂-N=C(CH₃)- |
| —COOC₂H₅ | 26-1 | 27-1 | 28-1 | 29-1 | 30-1 |
| —COCF₃ | 26-2 | 27-2 | 28-2 | 29-2 | 30-2 |
| —SO₂CH₃ | 26-3 | 27-3 | 28-3 | 29-3 | 30-3 |
| —CHO | 26-4 | 27-4 | 28-4 | 29-4 | 30-4 |
| Ph-N=C(Ph)- (PhN=CCH₃ with phenyl) | 26-5 | 27-5 | 28-5 | 29-5 | 30-5 |
| CH₃OC(=O)-N=C(CH₃)- | — | 27-6 | 28-6 | 29-6 | 30-6 |
| CH₃SO₂-N=C(CH₃)- | — | — | — | 29-7 | 30-7 |

$$\begin{array}{c} X\diagdown\quad\diagup W \\ C \\ \parallel \\ C \\ HO\diagup\quad\diagdown H \end{array}$$

| X | W | | | | |
|---|---|---|---|---|---|
| | CF₃SO₂-N=CH- | (NC)₂C=CH- | (NC)₂C=C(CH₃)- | (NC)₂C=C(CF₃)- | (NC)₂C=C(CN)- |
| —COOC₂H₅ | 31-1 | 32-1 | 33-1 | 34-1 | 35-1 |
| —COCF₃ | 31-2 | 32-2 | 33-2 | 34-2 | 35-2 |
| —CHO | 31-3 | 32-3 | 33-3 | 34-3 | 35-3 |
| —SO₂CH₃ | 31-4 | 32-4 | 33-4 | 34-4 | 35-4 |
| (NC)₂C=CH- | 31-5 | 32-5 | 33-5 | 34-5 | 35-5 |

-continued
| | | | | | |
|---|---|---|---|---|---|
| NC-C(CN)=C(CF₃)- | 31-6 | — | — | 34-6 | 35-6 |
| NC-C(CN)=C(CH₃)(CN) | 31-7 | — | — | — | 35-7 |
| | W | | | | |
|---|---|---|---|---|---|
| X | —CF₃ | —CH=CHCN | —CH=CHCHO | —C≡CCF₃ | —C≡CCN |
| —COOC₂H₅ | 36-1 | 37-1 | 38-1 | 39-1 | 40-1 |
| —COCF₃ | 36-2 | 37-2 | 38-2 | 39-2 | 40-2 |
| —SO₂CH₃ | 36-3 | 37-3 | 38-3 | 39-3 | 40-3 |
| —SO₂CF₃ | 36-4 | 37-4 | 38-4 | 39-4 | 40-4 |
| —CHO | 36-5 | 37-5 | 38-5 | 39-5 | 40-5 |
| 2-benzothiazolyl | 36-6 | 37-6 | 38-6 | 39-6 | 40-6 |
| —COOCH₂CH₂SCH₃ | 36-7 | 37-7 | 38-7 | 39-7 | 40-7 |
| | W | | | | |
|---|---|---|---|---|---|
| X | 3,4-dicyanophenyl | 2-benzoxazolyl | 2-(1,3,5-triazinyl) | Cl | H |
| —COOC₂H₅ | 41-1 | 42-1 | 43-1 | 44-1 | 45-1 |
| —COCF₃ | 41-2 | 42-2 | — | 44-2 | 45-2 |
| —SO₂CH₃ | 41-3 | 42-3 | 43-2 | 44-3 | 45-3 |
| —CHO | 41-4 | 42-4 | — | 44-4 | 45-4 |
| 2-pyrimidinyl | 41-5 | 42-5 | 43-3 | 44-5 | 45-5 |
| —COOCH₂CH₂SCH₃ | 41-6 | 42-6 | 43-4 | 44-6 | 45-6 |

Structure:

$$\begin{array}{c} X \diagdown \quad \diagup W \\ C=C \\ HO \diagup \quad \diagdown H \end{array}$$

| X | W: N-methylpyridinium Cl⁻ | W: dimethylsulfonium Cl⁻ | W: methyltriphenylphosphonium Cl⁻ | W: 2-methylpyranylium Br⁻ | W: 1-(2-methylthioethyl)-2-methylpyridinium Cl⁻ | W: trimethyl(isopropylidene)ammonium Cl⁻ | W: 1,2,3-trimethyl-4,5-dihydroimidazolium Cl⁻ |
|---|---|---|---|---|---|---|---|
| —COOC₂H₅ | 46-1 | 47-1 | 48-1 | 49-1 | 50-1 | 51-1 | 52-1 |
| —COCH₃ | — | — | — | — | — | 51-2 | 52-2 |
| —COCF₃ | 46-2 | 47-2 | 48-2 | 49-2 | 50-2 | | |
| —SO₂CH₃ | 46-3 | 47-3 | 48-3 | 49-3 | 50-3 | 51-3 | 52-3 |
| —SO₂CF₃ | — | — | — | — | — | 51-4 | 52-4 |
| —CHO | 46-4 | 47-4 | 48-4 | 49-4 | 50-4 | 51-5 | 52-5 |
| | | | | | | 51-6 | 52-6 |
| —COCH₂S-cyclohexyl | | | | | | 51-7 | 52-7 |
| —(2-pyrimidinyl) | 46-5 | 47-5 | 48-5 | 49-5 | 50-5 | | |
| —(2-pyridyl) | 46-6 | 47-6 | 48-6 | 49-6 | 50-6 | 51-8 | 52-8 |
| —COOCH₂CH₂SCH₃ | | | | | | | |

$$\begin{array}{c} X \diagdown \quad \diagup W \\ C=C \\ K^+ O^- \diagup \quad \diagdown H \end{array}$$

| X | —COCH₃ | —COCF₃ | —CHO | —COCH₂SCH₃ | —SO₂CH₃ |
|---|---|---|---|---|---|
| —COOC₂H₅ | 53-1 | 54-1 | 55-1 | 56-1 | 57-1 |
| —COCF₃ | — | 54-2 | 55-2 | 56-2 | 57-2 |
| —CHO | — | — | 55-3 | 56-3 | 57-3 |
| —SO₂CH₃ | — | — | — | 56-4 | 57-4 |
| —COCH₂SCH₃ | — | — | — | 56-5 | — |

-continued
| | | | | | |
|---|---|---|---|---|---|
| 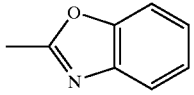 | 53-2 | 54-3 | 55-4 | 56-6 | 57-5 |
| —COOCH$_2$CH$_2$SCH$_3$ | 53-3 | 54-4 | 55-5 | 56-7 | 57-6 |
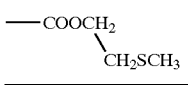
| | W | | | | |
|---|---|---|---|---|---|
| X | —SO$_2$CF$_3$ | 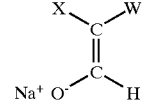 | 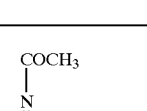 | 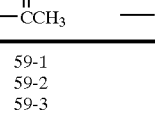 | 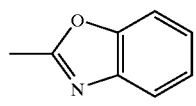 |
| —COOC$_2$H$_5$ | 58-1 | 59-1 | 60-1 | 61-1 | 62-1 |
| —COCH$_3$ | — | 59-2 | 60-2 | 61-2 | — |
| —CHO | — | 59-3 | 60-3 | 61-3 | — |
| —SO$_2$CF$_3$ | 58-2 | 59-4 | 60-4 | 61-4 | 62-2 |
| —COCH$_2$SCH$_3$ | 58-3 | 59-5 | 60-5 | 61-5 | — |
| 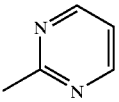 | 58-4 | 59-6 | 60-6 | 61-6 | 62-3 |
| —COOCH$_2$CH$_2$SCH$_3$ | 58-5 | 59-7 | 60-7 | 61-7 | 62-4 |
| —COCOOCH$_2$CH$_2$SCH$_3$ | 58-6 | 59-8 | 60-8 | 61-8 | 62-5 |
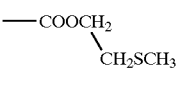
| | W | | | |
|---|---|---|---|---|
| X | —COCCl$_3$ | —COCF$_2$CF$_2$H | —CHO | —COCH$_2$SCH$_3$ |
| —COOCH$_2$CH$_2$SCH$_3$ | 63-1 | 64-1 | 65-1 | 66-1 |
| —COCF$_3$ | 63-2 | 64-2 | 65-2 | 66-2 |
| —CHO | 63-3 | 64-3 | 65-3 | 66-3 |
| —SO$_2$CF$_3$ | 63-4 | 64-4 | 65-4 | 66-4 |
| —COCH$_2$SCH$_3$ | 63-5 | 64-5 | 65-5 | 66-5 |

| X | W | | | | | |
|---|---|---|---|---|---|---|
| | —COCF$_3$ | —CHO | —COCH$_2$SCH$_3$ | NC-C(CH$_3$)=C(CN)(CH$_3$) | CH$_3$CO-N=C(CH$_3$)(CH$_3$) | 4-methyl-1,3,5-triazine |
| —COOC$_2$H$_5$ | 67-1 | 67-2 | — | 67-3 | 67-4 | — |
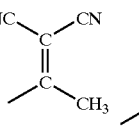
68-1
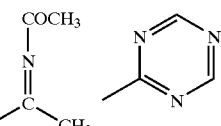
68-2
68-3
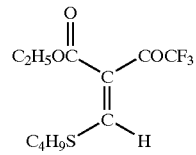
69-1
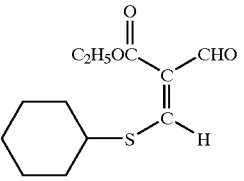
69-2
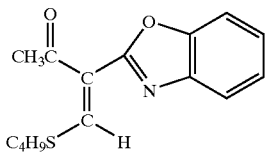
| R: | |
|---|---|
| —OH | 72-1 |
| —OC$_2$H$_5$ | 72-4 |
| —SCH$_3$ | 72-7 |

-continued
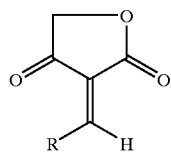
| R: | | |
|---|---|---|
| | —OH | 72-2 |
| | —O⁻Na⁺ | 72-3 |
| | —OCH₃ | 72-5 |
| | —SC₄H₉ | 72-6 |
| | —Cl | 72-8 |
72-9
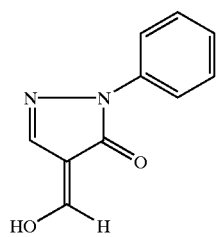
72-10
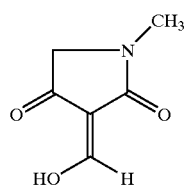
72-11
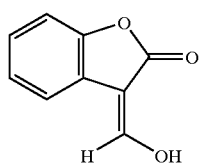
72-12
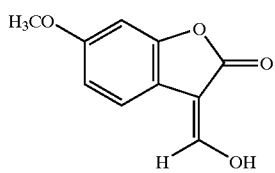
72-13
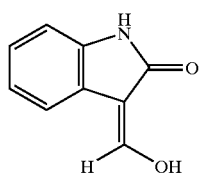
72-14

-continued
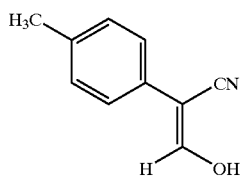
72-15
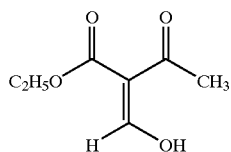
72-16
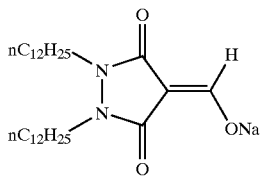
72-17
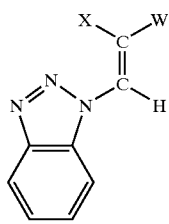
| X | W | | | | |
|---|---|---|---|---|---|
|  | —COCH$_3$ | —COCF$_3$ | —CHO | —COCH$_2$SCH$_3$ | —SO$_2$CH$_3$ |
| —COCOOC$_2$H$_5$ | 73-1 | 74-1 | 75-1 | 76-1 | 77-1 |
| —COCH$_3$ | 73-2 | 74-2 | 75-2 | 76-2 | 77-2 |
| —CHO | — | — | 75-3 | 76-3 | 77-3 |
| —SO$_2$CF$_3$ | 73-3 | 74-3 | 75-4 | 76-4 | 77-4 |
| benzoxazol-2-yl | 73-4 | 74-4 | 75-5 | 76-5 | 77-5 |
| —COCOOCH$_2$CH$_2$SCH$_3$ | 73-5 | 74-5 | 75-6 | 76-6 | 77-6 |
| —COCONHCH$_2$CH$_2$SCH$_3$ | 73-6 | 74-6 | 75-7 | 76-7 | 77-7 |

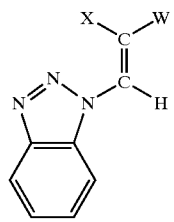
| X | W |||||
|---|---|---|---|---|---|
| | —SO$_2$CF$_3$ | COCH$_3$<br>\|<br>N<br>\|\|<br>CCH$_3$ | SO$_2$CH$_3$<br>\|<br>N<br>\|\|<br>CCH$_3$ | NC\C/CN<br>\|\|<br>C<br>/\<br>CH$_3$ H | 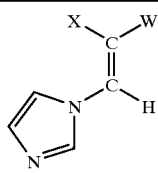 |
| —COCOOC$_2$H$_5$ | 78-1 | 79-1 | 80-1 | 81-1 | 82-1 |
| —COCH$_3$ | — | 79-2 | 80-2 | 81-2 | — |
| —CHO | — | 79-3 | 80-3 | 81-3 | — |
| —SO$_2$CF$_3$ | 78-2 | 79-4 | 80-4 | 81-4 | 82-2 |
| 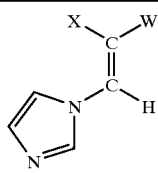 | 78-3 | 79-5 | 80-5 | 81-5 | 82-3 |
| —COCOOCH$_2$<br>\|<br>CH$_2$SCH$_3$ | 78-4 | 79-6 | 80-6 | 81-6 | 82-4 |
| —COCONHCH$_2$<br>\|<br>CH$_2$SCH$_3$ | 78-5 | 79-7 | 80-7 | 81-7 | 82-5 |
| X | W |||||
|---|---|---|---|---|---|
| | —COCH$_3$ | —COCF$_3$ | —CHO | —COCH$_2$SCH$_3$ | —SO$_2$CH$_3$ |
| —COCOOC$_2$H$_5$ | 83-1 | 84-1 | 85-1 | 86-1 | 87-1 |
| —COCH$_3$ | 83-2 | 84-2 | 85-2 | 86-2 | 87-2 |
| —CHO | — | — | 85-3 | 86-3 | 87-3 |
| —SO$_2$CF$_3$ | 83-3 | 84-3 | 85-4 | 86-4 | 87-4 |
| 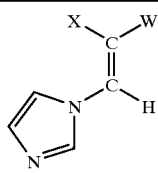 | 83-4 | 84-4 | 85-5 | 86-5 | 87-5 |
| —COCOOCH$_2$<br>\|<br>CH$_2$SCH$_3$ | 83-5 | 84-5 | 85-6 | 86-6 | 87-6 |
| —COCONHCH$_2$<br>\|<br>CH$_2$SCH$_3$ | 83-6 | 84-6 | 85-7 | 86-7 | 87-7 |

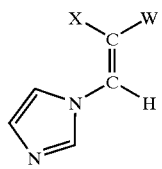

| X | W —SO₂CF₃ | $\begin{array}{c}COCH_3\\|\\N\\||\\—CH\end{array}$ | $\begin{array}{c}SO_2CH_3\\|\\N\\||\\—CH\end{array}$ | NC\C/CN \C/ H | (benzoxazole) |
|---|---|---|---|---|---|
| —COCOOC₂H₅ | 88-1 | 89-1 | 90-1 | 91-1 | 92-1 |
| —COCH₃ | — | 89-2 | 90-2 | 92-2 | — |
| —CHO | — | 89-3 | 90-3 | 91-3 | — |
| —SO₂CF₃ | 88-2 | 89-4 | 90-4 | 91-4 | 92-2 |
| (benzoxazole) | 88-3 | 89-5 | 90-5 | 91-5 | 92-3 |
| —COCOOCH₂<br>\|<br>CH₂SCH₃ | 88-4 | 89-6 | 90-6 | 91-6 | 92-4 |
| —COCONHCH₂<br>\|<br>CH₂SCH₃ | 88-5 | 89-7 | 90-7 | 91-7 | 92-5 |

The hydrazine derivatives are represented by the following formula (H):

$$A_0-\underset{\underset{A_1}{|}}{N}-\underset{\underset{A_2}{|}}{N}-B_0 \qquad \text{formula (H)}$$

In the formula, $A_0$ is an aliphatic group, an aromatic group, or a heterocyclic group, each of which may have a substituent, or $-G_0-D_0$; $B_0$ is a blocking group; $A_1$ and $A_2$ are both hydrogen atoms, or when one of them is a hydrogen atom, the other is an acyl group, a sulfonyl group or an oxalyl group, in which $G_0$ is —CO—, —COCO—, —CS—, —C(=NG₁D₁)—, —SO—, —SO₂— or —P(O)(G₁D₁)—, in which $G_1$ is simply a bond, or —O—, —S— or —N(D₁)—, in which $D_1$ is a hydrogen atom, or an aliphatic group, an aromatic group or a heterocyclic group, provided that when plural $D_1$s are present in the molecule, they may be the same as or different from each other and $D_0$ is a hydrogen atom, an aliphatic group, an aromatic group, a heterocyclic group, an amino group, an alkoxy group, an aryloxy group, an alkylthio group or an arylthio group. Preferred $D_0$ is a hydrogen atom, an alkyl group, an alkoxy group, or an amino group.

In formula (H), the aliphatic group represented by $A_0$ is preferably one having 1 to 30 carbon atoms, more preferably a straight-chained, branched or cyclic alkyl group having 1 to 20 carbon atoms. Examples thereof are methyl, ethyl, t-butyl, octyl, cyclohexyl and benzyl, each of which may have an appropriate substituent (such as aryl, alkoxy, aryloxy, alkylthio, arylthio, sulfoxy, sulfonamido, sulfamoyl, acylamino or ureido).

In Formula (H), the aromatic group represented by $A_0$ is preferably a monocyclic or condensed-polycyclic aryl group such as a benzene ring or a naphthalene ring. The heterocyclic group represented by $A_0$ is preferably a monocyclic or condensed-polycyclic one containing at least one heteroatom selected from nitrogen, sulfur and oxygen such as a a pyrrolidone ring, an imidazole ring, a tetrahydrofuran ring, a morpholine ring, a pyridine ring, a pyrimidine ring, a quinoline ring, a thiazole ring, a benzothiazole ring, a thiophene ring or a furan ring. The aromatic group, heterocyclic group or $-G_0-D_0$ represented by $A_0$ each may be substituted. Specifically preferred $A_0$ is an aryl group or $-G_0-D_0$.

In Formula (H), $A_0$ contains preferably a non-diffusible group or a group for promoting adsorption to silver halide. As the non-diffusible group is preferable a ballast group used in immobile photographic additives such as a coupler. The ballast groups include an alkyl group, an alkenyl group, an alkynyl group, an alkoxy group, a phenyl group, a phenoxy group and an alkylphenoxy group, each of which has 8 or more carbon atoms and is photographically inert.

In Formula (H), the groups for promoting adsorption to silver halide include a thioureido group, a thiourethane group, a mercapto group, a thioether group, a thione group, a heterocyclic group, a thioamido group, a mercapto-heterocyclic group or an adsorption group as described in JP A 64-90439.

In Formula (H), $B_0$ is a blocking group, and preferably $-G_0-D_0$, wherein $G_0$ is —CO—, —COCO—, —CS—, —C(=NG₁D₁)—, —SO—, —SO₂— or —P(O) (G₁D₁)—, and preferred $G_0$ is a —CO—, —COCO—, in which $G_1$ is simply a bond, or —O—, —S— or —N(D₁)—, in which $D_1$ represents a hydrogen atom, or an aliphatic group, an aromatic group or a heterocyclic group, provided that when plural $D_1$s are present, they may be the same as or different from each other. $D_0$ is a hydrogen atom, an aliphatic group, an aromatic group, a heterocyclic group, an amino group, an alkoxy group, an aryloxy group, an alkylthio group, or an arylthio group, and preferably, a hydrogen atom, an alkyl group, an alkoxy group or an amino group. $A_1$ and $A_2$ are both hydrogen atoms, or when one of them is a hydrogen atom, the other is an acyl group (acetyl, trifluoroacetyl or benzoyl), a sulfonyl group (methanesulfonyl or toluenesulfonyl) or an oxalyl group (ethoxalyl).

A compound represented by formula [H] is exemplified as below, but the present invention is not limited thereto.

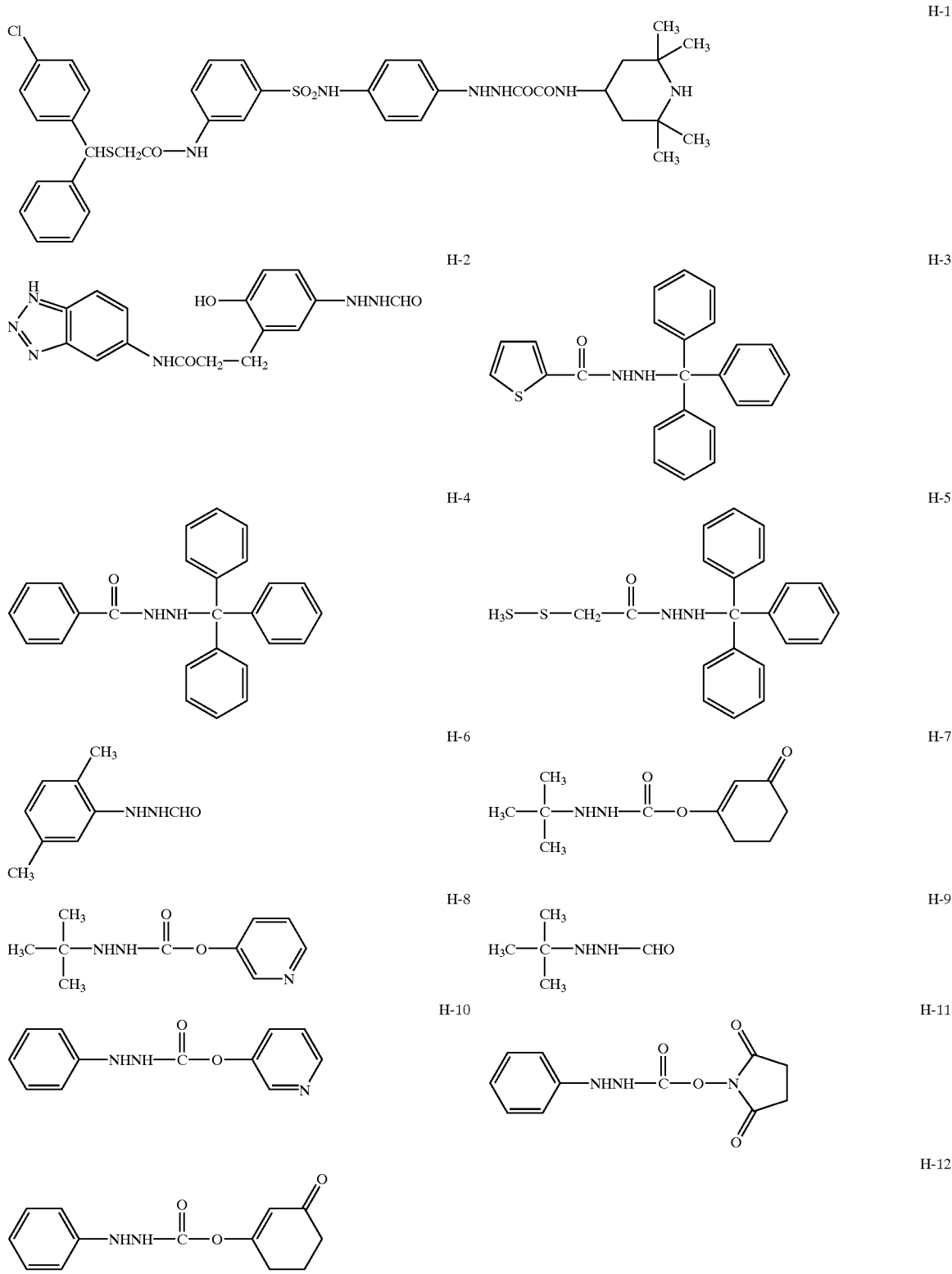

More preferred hydrazine compounds are represented by the following formulas (H-1), (H-2), (H-3) and (H-4):

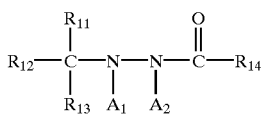

formula (H-1)

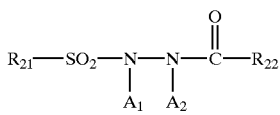

formula (H-2)

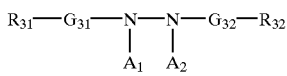

formula (H-3)

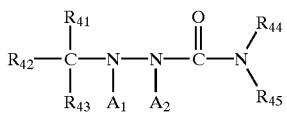

formula (H-4)

In formula (H-1), $R_{11}$, $R_{12}$ and $R_{13}$ are each a substituted or unsubstituted aryl group or substituted or unsubstituted heteroaryl group (i.e., an aromatic heterocyclic group). Examples of the aryl group represented by $R_{11}$, $R_{12}$ or $R_{13}$ include phenyl, p-methylphenyl and naphthyl and examples of the heteroaryl group include a triazole residue, an imidazole residue, a pyridine residue, a furan residue and a thiophene residue. $R_{11}$, $R_{12}$ or $R_{13}$ may combine together with each other through a linkage group. Substituents which $R_{11}$, $R_{12}$ or $R_{13}$ each may have include, for example, an alkyl group, an alkenyl group, an alkynyl group, an aryl group, a heterocyclic group, a quaternary nitrogen containing heterocyclic group (e.g., pyridionyl), a hydroxy group, an alkoxy group (including containing a repeating unit of ethyleneoxy or propyleneoxy), an aryloxy group, an acyloxy group, an acyl group, an alkoxycarbonyl group, an aryloxycarbonyl group, a carbamoyl group, a urethane group, a carboxyl group, an imido group, an amino group, a carbonamido group, a sulfonamido group, a ureido group, a thioureido group, a sulfamoylamino group, a semicarbazido group, a thiosemicarbazido group, a hydrazino group, a quaternary ammonio group, an alkyl-, aryl- or heterocyclic-thio group, a mercapto group, an alkyl- or aryl-sufonyl group, an alkyl- or aryl-sulfinyl group, a sulfo group, a sulfamoyl group, an acylsufamoyl group, an alkyl or aryl-sulfonylureido group, an alkyl- or aryl-sulfonylcarbamoyl group, a halogen atom, cyano, nitro, and a phosphoric acid amido group. All of $R_{11}$, $R_{12}$ and $R_{13}$ are preferably substituted or unsubstituted phenyl groups and more preferably unsubstituted phenyl groups.

$R_{14}$ is a heteroaryloxy group or a heteroarylthio group. Examples of the heteroaryloxy group represented by $R_{14}$ include a pyridyloxy group, a pyrimidyloxy group, an indolyloxy group, a benzothiazolyl group, a benzimidazolyloxy group, a furyloxy group, a thienyloxy group, a pyrazolyloxy group, and an imidazolyloxy group; and examples of the heteroarylthio group include a pyridylthio group, a pyrimidylthio group, an indolylthio group, a benzothiazolylthio, a benzoimidazolylthio group, a furylthio group, a thienylthio group, a pyrazolylthio group, and an imidazolylthio group. $R_{14}$ is preferably a pyridyloxy or thienyloxy group.

$A_1$ and $A_2$ are both hydrogen atoms, or one of them is a hydrogen atom and the other is an acyl group (e.g., acetyl, trifluoroacetyl, benzoyl, etc.), a sulfonyl group (e.g., methanesulfonyl, toluenesulfonyl, etc.), or an oxalyl group (e.g., ethoxalyl, etc.). $A_1$ and $A_2$ are both preferably hydrogen atoms.

In formula (H-2), $R_{21}$ is a substituted or unsubstituted alkyl group, an aryl group or a heteroaryl group. Examples of the alkyl group include methyl, ethyl, t-butyl, 2-octyl, cyclohexyl, benzyl, and diphenylmethyl; examples of the aryl group or the heteroaryl group are the same as those defined in $R_{11}$, R and $R_{13}$. Where $R_{21}$ has a substituent, examples of the substituent are the same as those defined in $R_{11}$, $R_{12}$ and $R_{13}$. $R_{21}$ is preferably an aryl group or a heteroaryl group, and more preferably a phenyl group.

$R_{22}$ is a hydrogen atom, an alkylamino group, an arylamino group, or a heteroarylamino group. Examples of the alkylamino group include methylamino, ethylamino, propylamino, butylamino, dimethylamino, diethylamino, and ethylmethylamino. Examples of the arylamino group include an anilino group; examples of the heteroaryl group include thiazolylamino, benzimidazolylamino and benzthiazolylamino. $R_{22}$ is preferably dimethylamino or diethylamino. $A_1$ and $A_2$ are the same as defined in formula (H-1).

In formula (H-3), $R_{31}$ and $R_{32}$ are each a hydrogen atom, a univalent substituent group. The univalent substituent groups represented by $R_{31}$ and $R_{32}$ are the same as defined in $R_{11}$, $R_{12}$, and $R_{13}$ of formula (H-1), preferably an alkyl group, an aryl group, a heteroaryl group, an alkoxy group and an amino group, and more preferably an aryl group or an alkoxy group. It is especially preferable that at least one of $R_{31}$ and $R_{32}$ is t-butoxy, or when $R_{31}$ is phenyl, $R_{32}$ is t-butoxy.

$G_{31}$ and $G_{32}$ are each —CO—, —CO—CO— or —C(=S)—, a sulfonyl group, a sulfoxy group, a —P(=O) $R_{33}$— group, or an iminomethylene group, in which $R_{33}$ is an alkyl group, an alkenyl group, an alkynyl group, an aryl group, an alkoxy group, an alkenyloxy group, an alkynyloxy group, an arylamino group or an amino group, provided that when $G_{31}$ is a sulfonyl group, $G_{32}$ is not a carbonyl group. $G_{31}$ and $G_{32}$ are preferably —CO—, —COCO—, a sulfonyl group or —CS—, and more preferably —CO— or a sulfonyl group. $A_1$ and $A_2$ are the same as defined in $A_1$ and $A_2$ of formula (H-1).

In formula (H-4), $R_{41}$, $R_{42}$ and $R_{43}$ are the same as defined in $R_{11}$, $R_{12}$ and $R_{13}$ of formula (H-1). $R_{41}$, $R_{42}$ and $R_{43}$ are preferably a substituted or unsubstituted phenyl group, and more preferably all of $R_{41}$, $R_{42}$ and $R_{43}$ are unsubstituted phenyl groups. $R_{44}$ and $R_{45}$ are each a substituted or unsubstituted alkyl group and examples thereof include methyl, ethyl, t-butyl, 2-octyl, cyclohexyl, benzyl, and diphenylmethyl. $R_{44}$ and $R_{45}$ are preferably ethyl groups. $A_1$ and $A_2$ are the same as defined in $A_1$ and $A_2$ of formula (H-1).

Exemplary examples of the compounds represented by formulas (H-1) through (H-4) are shown below but are by no means limited to these.

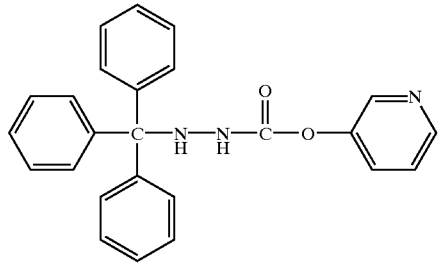

H-1-1

H-1-2
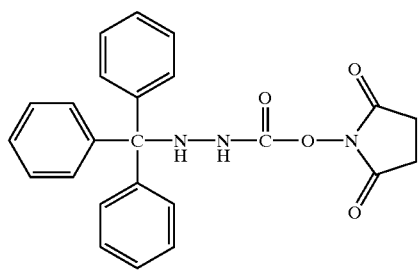
H-1-7
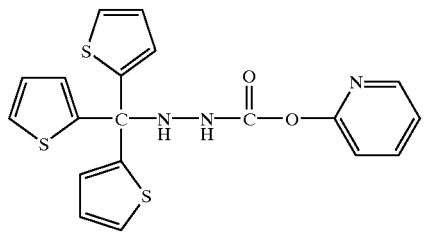
H-1-3
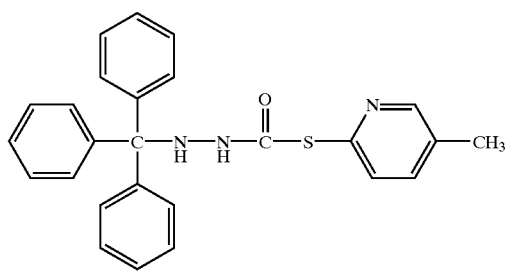
H-1-8
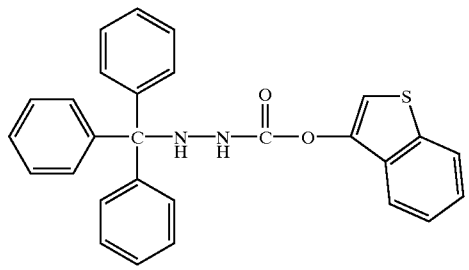
H-2-1
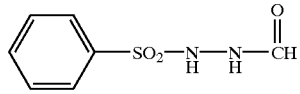
H-1-4
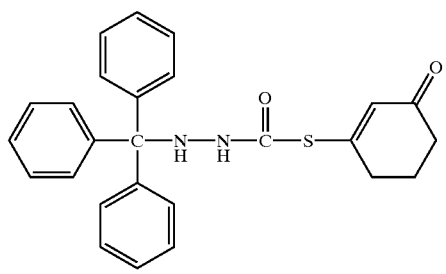
H-2-2
H-2-3
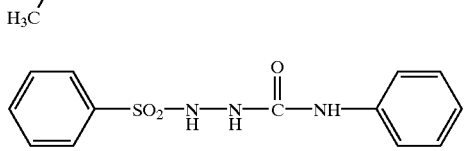
H-1-5
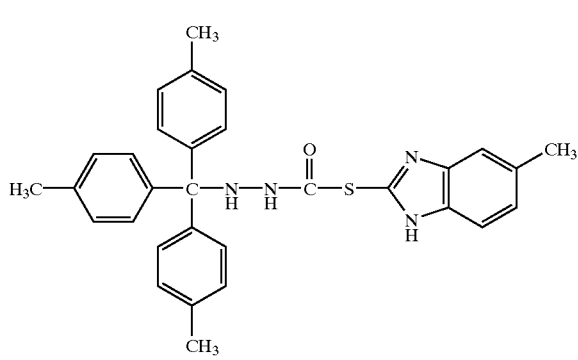
H-2-4
H-2-5
H-3-1
H-3-2
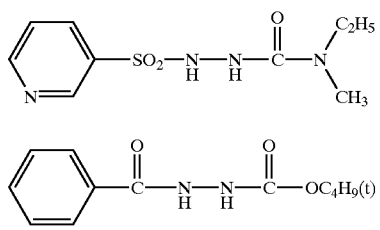
H-1-6
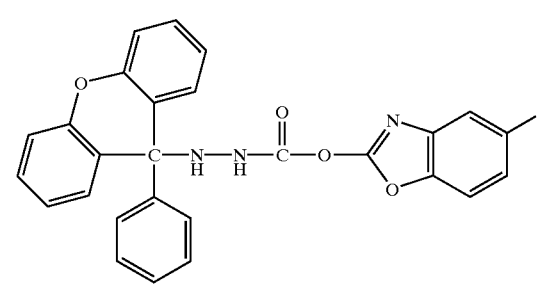
H-3-3
H-3-4

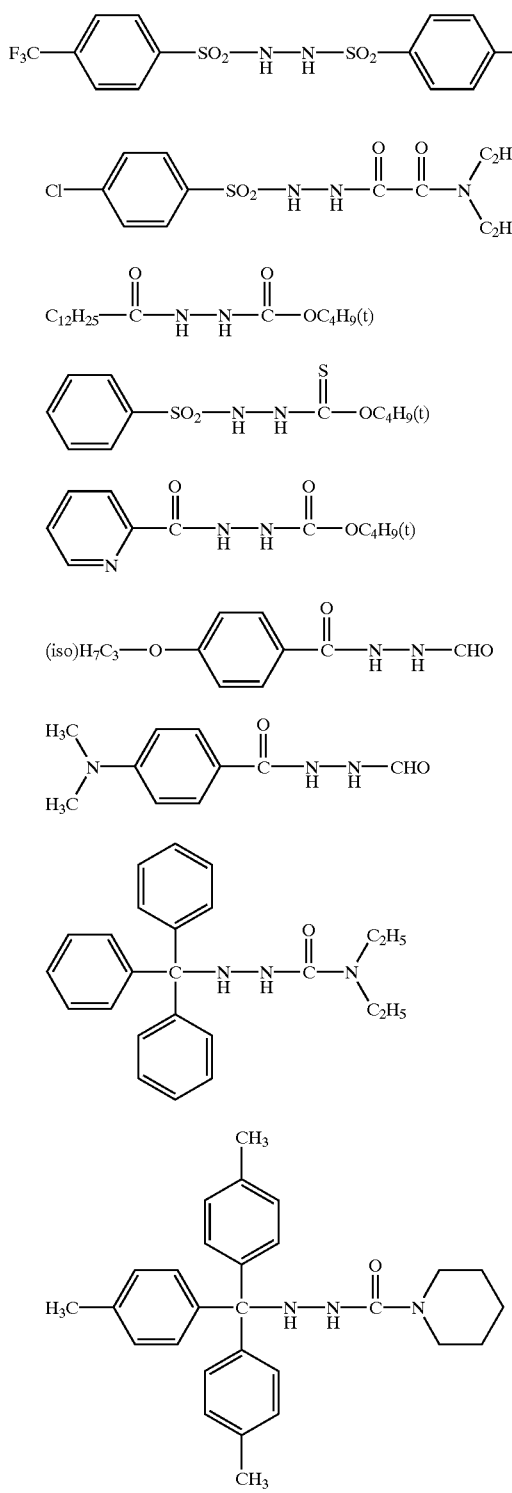

The compounds of formulas (H-1) through (H-4) can be readily synthesized in accordance with methods known in the art, as described in, for example, U.S. Pat. Nos. 5,467,738 and 5,496,695.

Furthermore, preferred hydrazine derivatives include compounds H-1 through H-29 described in U.S. Pat. No. 5,545,505, col. 11 to col. 20; and compounds 1 to 12 described in U.S. Pat. No. 5,464,738, col. 9 to col. 11. These hydrazine derivatives can be synthesized in accordance with commonly known methods.

The addition amount of the contrast-increasing agent described above is in the range of from $10^{-5}$ to 1 mol, and preferably from $10^{-4}$ to $5 \times 10^{-1}$ mol of per mol of silver.

Light sensitive silver halide grains having an average grain size of 0.01 to 0.1 μm are preferably prepared in advance separately from organic silver salt grains, and these can be prepared according to the methods commonly known in the photographic art, such as single jet or double jet addition, or ammoniacal, neutral or acidic precipitation. To sufficiently bring the light sensitive silver halide into contact with an organic silver salt, there can be applied such techniques that polymers other than gelatin, such as polyvinyl acetal are employed as a protective colloid in the formation of light sensitive silver halide, as described in U.S. Pat. Nos. 3,706,564, 3,706,565 3,713,833 and 3,748,143, British Patent 1,362,970; gelatin contained in a light sensitive silver halide emulsion is degraded with an enzyme, as described in British Patent 1,354,186; or light sensitive silver halide grains are prepared in the presence of a surfactant to save the use of a protective polymer, as described in U.S. Pat. No. 4,076,539.

The silver halide grains having an average grain size of from 0.01 to 0.1 μm have light sensitivity and functions as light sensor. The form of silver halide grains is not specifically limited, including cubic or octahedral, regular crystals and non-regular crystal grains in a spherical, bar-like or tabular form. Halide composition thereof is not specifically limited, including any one of silver chloride, silver chlorobromide, silver iodochlorobromide, silver bromide, silver iodobromide, and silver iodide.

In the invention, silver halide grains having a grain size of less than 0.01 μm are preferably used in combination, in addition to the silver halide grains having an average grain size of from 0.01 to 0.1 μm. The silver halide grains having a grain size of less than 0.01 μm are preferably contained in an amount of not less than 1%, and more preferably 5 to 70%, based on the total silver halide grains. These silver halide grains can be prepared according to any method, but can preferably be prepared in such a manner that in the process of forming organic silver salts, a halide component such as a halide ion is allowed to be present concurrently with an organic silver salt-forming component and silver ions are added thereto to form silver halide grains simultaneously with the formation of an organic silver salt, as described in British patent No. 1,447,454.

The silver halide forming component is used stoichiometrically in a small amount per organic silver salt. Thus, it is preferably 0.001 to 0.7 mol, and more preferably 0.03 to 0.5 mol per mol of organic silver salt. The silver halide-forming component may be used in combination. Conditions including a reaction temperature, reaction time and reaction pressure during the process of converting a part of the organic silver salt to silver halide using the silver halide forming component can be appropriately set in accordance with the purpose of preparation. The reaction temperature is preferably 20° C. to 70° C., the reaction time is preferably 0.1 sec to 72 hrs., and the reaction pressure is preferably atmospheric pressure. The reaction is performed preferably in the presence of polymer as a binder, wherein the polymer to be used is preferably 0.01 to 100 weight parts, and more preferably 0.1 to 10 weight parts per 1 weight part of organic silver salt.

In the invention, the light sensitive silver halide grain emulsions may or may not be carried out after the grain formation, but when desalted, can be desalted using the methods known in the art, such as the noodle washing method and flocculation process.

The light sensitive silver halide grains in this invention may be subjected to chemical sensitization. Preferred chemical sensitizations include chemical sensitizations commonly known in the art, such as sulfur sensitization, selenium sensitization, tellurium sensitization, noble metal sensitization using gold compounds or platinum, palladium and iridium compounds, and reduction sensitization.

As compounds used for sulfur sensitization, selenium sensitization, or tellurium sensitization, commonly known compounds can be used, for example, as described in JP-A No. 7-128768. Examples of preferred compounds used for noble metal sensitization include chloroauric acid, potassium chloroaurate, potassium auriothiocyanate, gold selenide, gold selenide and compounds described in U.S. Pat. No. 2,448,060 and British Patent No. 618,061.

Examples of compounds used for reduction sensitization include stannous chloride, aminoiminomethanesulfinic acid, hydrazine derivatives, borane compounds, silane compounds and polyamini compounds as well as ascorbic acid and thiourea dioxide. The reduction sensitization can be conducted ripening the emulsion at a pH of not less than 7 or at a pAg of not more than 8.3. Further, reduction sensitization can be achieved by single introduction of silver ions during the grain formation. The method and procedure for chemical sensitization are described in U.S. Pat. No. 4,036,650, British Patent No. 1,518,850, JP-A Nos. 51-22430, 51-78319 and 51-81124. As described in U.S. Pat. No. 3,980,482, a low molecular weight amide compound may be concurrently present to enhance sensitivity at the time of converting a part of the organic silver salt to light sensitive silver halide.

The silver halide used in the invention preferably contains ions of metals belonging to from the 6th group to 10th group in the Periodical Table, and as such metals are W, Fe, Co, Ni, Cu, Ru, Rh, Pd, Re, Os, Ir, Pt, and Au.

These metals may be incorporated into silver halide in the form of metal complexes or metal complex ions. As the metal complexes or metal complex ions, six-coordinate metal complexes represented by the general formula described below are preferred.

General formula $(ML_6)^m$ wherein M represents a transition metal selected from elements belonging to from the 6th group to 11th group in the Periodical Table; L represents a ligand; and m represents 0, −1, −2, −3, or −4. Specific examples represented by L include halogens (fluorine, chlorine, bromine, and iodine), cyan, cyanato, thiocyanato, selenocyanato, tellurocyanato, a ligand such as azido or aquo, nitrosyl, thionitrosyl, etc., of which aquo, nitrosyl and thionitrosyl are preferred.

When the aquo ligand is present, one or two ligands are preferably coordinated. L may be the same or different.

The particularly preferred specific example of M is rhodium (Rh), ruthenium (Ru), rhenium (Re), iridium (Ir) or osmium (Os).

Specific examples of transition metal ligand complexes are described below, but the invention is not limited thereto.
1: $[RhCl_6]^{3-}$
2: $[RuCl_6]^{3-}$
3: $[ReCl_6]^{3-}$
4: $[RuBr_6]^{3-}$
5: $[OsCl_6]^{3-}$
6: $[IrCl_6]^{4-}$
7: $[Ru(NO)Cl_5]^{2-}$
8: $[RuBr_4(H_2O)]^{2-}$
9: $[Ru(NO)(H_2O)Cl_4]^-$
10: $[RhCl_5(H_2O)]^{2-}$
11: $[Re(NO)Cl_5]^{2-}$
12: $[Re(NO)CN_5]^{2-}$
13: $[Re(NO)Cl(CN)_4]^{2-}$
14: $[Rh(NO)_2Cl_4]^-$
15: $[Rh(NO)(H_2O)Cl_4]^-$
16: $[Ru(NO)(CN)_5]^{2-}$
17: $[Fe(CN)_6]^{3-}$
18: $[Rh(NS)Cl_5]^{2-}$
19: $[Os(NO)Cl_5]^{2-}$
20: $[Cr(NO)Cl_5]^{2-}$
21: $[Re(NO)Cl_5]^-$
22: $[Os(NS)Cl_4(TeCN)]^{2-}$
23: $[Ru(NS)Cl_5]^{2-}$
24: $[Re(NS)Cl_4(SeCN)]^{2-}$
25: $[Os(NS)Cl(SCN)_4]^{2-}$
26: $[Ir(NO)Cl_5]^{2-}$
27: $[Ir(NS)Cl_5]^{2-}$ The metals in these metal ions or metal complex ions may be used singly or as a mixture of two or more kinds thereof.

The content of these metal ions or metal complex ions is suitably between $1\times10^{-9}$ and $1\times10^{-2}$ mole per mole of silver halide, and is preferably between $1\times10^{-8}$ and $1\times10^{-4}$ mole per mole of silver halide.

Compounds, which provide these metals, are preferably incorporated into silver halide grains through addition during the silver halide grain formation. These may be added during any preparation stage of the silver halide grains, that is, before or after nuclei formation, growth, physical ripening, and chemical ripening. However, these are preferably added at the stage of nuclei formation, growth, and physical ripening; furthermore, are preferably added at the stage of nuclei formation and growth; and are most preferably added at the stage of nuclei formation.

These compounds may be added several times by dividing the added amount. Uniform content in the interior of a silver halide grain can be carried out. As described in Japanese Patent Publication Open to Public Inspection No. 63-29603, 2-306236, 3-167545, 4-76534, 6-110146, 5-273683, etc., incorporation can be carried out so as to result preferably in distribution formation in the interior of a grain.

These metal compounds can be dissolved in water or a suitable organic solvent (for example, alcohols, ethers, glycols, ketones, esters, amides, etc.) and then added. Furthermore, there are methods in which, for example, an aqueous metal compound powder solution or an aqueous solution in which a metal compound is dissolved along with NaCl and KCl is added to a water-soluble silver salt solution during grain formation or to a water-soluble halide solution; when a silver salt solution and a halide solution are simultaneously added, a metal compound is added as a third solution to form silver halide grains, while simultaneously mixing three solutions; during grain formation, an aqueous solution comprising the necessary amount of a metal compound is placed in a reaction vessel; or during silver halide preparation, dissolution is carried out by the addition of other silver halide grains previously doped with metal ions or complex ions. Specifically, the preferred method is one in which an aqueous metal compound powder solution or an aqueous solution in which a metal compound is dissolved along with NaCl and KCl is added to a water-soluble halide solution. When the addition is carried out onto grain surfaces, an aqueous solution comprising the necessary amount of a metal compound can be placed in a reaction vessel immediately after grain formation, or during physical ripening or at the completion thereof or during chemical ripening.

When the addition is carried out onto grain surfaces, an aqueous solution comprising the necessary amount of a metal compound can be placed in a reaction vessel immediately after grain formation, or during physical ripening or at the completion thereof or during chemical ripening.

The physical developing nuclei are contained in the light sensitive layer containing a light sensitive silver halide grains, in the physical developing nucleus layer provided on the light sensitive layer, or in the developing nucleus layer provided between the support and the light sensitive layer. The physical developing nucleus content of the planographic printing plate material of the invention is ordinarily from $10^{-5}$ to $10^{-1}$ g/m$^2$.

Examples of the physical developing nuclei include colloid particles of metals such as silver, antimony, bismuth, cadmium, cobalt, lead, nickel, palladium, rhodium, gold, or platinum, of sulfides, polysulfides or selenides of these metals, or mixtures or mixed crystals thereof. The physical developing nucleus layer does not need to contain a hydrophilic binder, but may contain a hydrophilic polymer such as gelatin, starch, dialdehyde starch, carboxymethyl cellulose, gum arabic, sodium alginate, hydroxyethyl cellulose, polystyrene sulfonic acid, poly (sodium acrylate), a copolymer of vinyl imidazole and acrylamide, a copolymer of acrylic acid and acrylamide, or polyvinyl alcohol or their oligomer. The hydrophilic polymer content is preferably not more than 0.5 g/m$^2$. The physical developing nucleus layer may contain a matting agent, a reducing agent or an image toning agent.

Organic silver salts used in the invention are reducible silver source, and silver salts of organic acids or organic heteroacids are preferred and silver salts of long chain fatty acid (preferably having 10 to 30 carbon atom and more preferably 15 to 25 carbon atoms) or nitrogen containing heterocyclic compounds are more preferred. Specifically, organic or inorganic complexes, ligand of which have a total stability constant to a silver ion of 4.0 to 10.0 are preferred. Exemplary preferred complex salts are described in Research Disclosure (hereinafter, also denoted as RD) 17029 and RD29963, including organic acid salts (for example, salts of gallic acid, oxalic acid, behenic acid, arachidic acid, stearic acid, palmitic acid, lauric acid, etc.); carboxyalkylthiourea salts (for example, 1-(3-carboxypropyl)thiourea, 1-(3-caroxypropyl)-3,3-dimethylthiourea, etc.); silver complexes of polymer reaction products of aldehyde with hydroxy-substituted aromatic carboxylic acid (for example, aldehydes (formaldehyde, acetaldehyde, butylaldehyde, etc.), hydroxy-substituted acids (for example, salicylic acid, benzoic acid, 3,5-dihydroxybenzoic acid, 5,5-thiodisalicylic acid, silver salts or complexes of thiones (for example, 3-(2-carboxyethyl)-4-hydroxymethyl-4-(thiazoline-2-thione and 3-carboxymethyl-4-thiazoline-2-thione), complexes of silver with nitrogen acid selected from imidazole, pyrazole, urazole, 1,2,4-thiazole, and 1H-tetrazole, 3-amino-5-benzylthio-1,2,4-triazole and benztriazole or salts thereof; silver salts of saccharin, 5-chlorosalicylaldoxime, etc.; and silver salts of mercaptides. of these organic silver salts, silver behenate, silver arachidate and silver stearate are specifically preferred.

The organic silver salt compound can be obtained by mixing an aqueous-soluble silver compound with a compound capable of forming a complex. Normal precipitation, reverse precipitation, double jet precipitation and controlled double jet precipitation described in JP-A 9-127643 are preferably employed. For example, to an organic acid is added an alkali metal hydroxide (e.g., sodium hydroxide, potassium hydroxide, etc.) to form an alkali metal salt soap of the organic acid (e.g., sodium behenate, sodium arachidate, etc.), thereafter, the soap and silver nitrate are mixed by the controlled double jet method to form organic silver salt crystals. In this case, silver halide grains may be concurrently present.

In the present invention, organic silver salts have an average grain size of 2 μm or less and are monodisperse. Monodisperse grains refer to those exhibiting a dispersity as defined below of not more than 50%. The dispersity is preferably not more than 40%, and more preferably 0.1 to 35%.

Dispersity (%)=(standard deviation of grain size)×100/(average grain size)

The average grain size of the organic silver salt as described herein is, when the grain of the organic salt is, for example, a spherical, cylindrical, or tabular grain, a diameter of the sphere having the same volume as each of these grains. The average grain size is preferably between 0.05 and 1.5 μm, and more preferably between 0.05 and 1.0 μm. It is also preferred that at least 60% of the total of the organic silver salt is accounted for by tabular grains. The tabular grains refer to grains having a ratio of an average grain size to grain thickness, i.e., aspect ratio (denoted as AR) of 3 or more:

AR=average grain size (μm)/grain thickness (μm) To obtain such tabular organic silver salts, organic silver salt crystals are pulverized together with a binder or surfactant, using a ball mill.

To prevent hazing of the planographic printing plate material, the total amount of silver halide and organic silver salt is preferably 0.5 to 2.2 g/m$^2$ in equivalent converted to silver.

The planographic printing plate material of the invention preferably contains a reducing agent. Examples of suitable reducing agents are described in U.S. Pat. Nos. 3,770,448, 3,773,512, and 3,593,863, and Research Disclosure Items 17029 and 29963, and include the following: aminohydroxycycloalkenone compounds (for example, 2-hydroxypiperidino-2-cyclohexane); esters of amino reductones as the precursor of reducing agents (for example, piperidinohexose reducton monoacetate); N-hydroxyurea derivatives (for example, N-p-methylphenyl-N-hydroxyurea); hydrazones of aldehydes or ketones (for example, anthracenealdehyde phenylhydrazone; phosphamidophenols; phosphamidoanilines; polyhydroxybenzenes (for example, hydroquinone, t-butylhydroquinone, isopropylhydroquinone, and (2,5-dihydroxy-phenyl) methylsulfone); sulfydroxamic acids (for example, benzenesulfhydroxamic acid); sulfonamidoanilines (for example, 4-(N-methanesulfonamide)aniline); 2-tetrazoly- lthiohydroquinones (for example, 2-methyl-5-(1-phenyl-5-tetrazolylthio)hydroquinone); tetrahydroquionoxalines (for example, 1,2,3,4-tetrahydroquinoxaline); amidoxines; azines (for example, combinations of aliphatic carboxylic acid arylhydrazides with ascorbic acid); combinations of polyhydroxybenzenes and hydroxylamines, reductones and/or hydrazine; hydroxamic acids; combinations of azines with sulfonamidophenols; α-cyanophenylacetic acid derivatives; combinations of bis-β-naphthol with 1,3-dihydroxybenzene derivatives; 5-pyrazolones, sulfonamidophenol reducing agents, 2-phenylindane-1,3-dione, etc.; chroman; 1,4-dihydropyridines (for example, 2,6-dimethoxy-3,5-dicarboethoxy-1,4-dihydropyridine); bisphenols (for example, bis(2-hydroxy-3-t-butyl-5-methylphenyl)methane, bis(6-hydroxy-m-tri)mesitol, 2,2-bis(4-hydroxy-3-methylphenyl)propane, 4,5-ethylidene-bis (2-t-butyl-6-methyl)phenol, UV-sensitive ascorbic acid derivatives and 3-pyrazolidones. Of these, particularly preferred reducing agents are hindered phenols.

As preferred hindered phenols, listed are compounds represented by the general formula (A) described below:

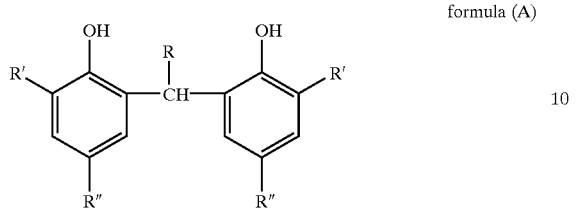

formula (A)

wherein R represents a hydrogen atom or an alkyl group having from 1 to 10 carbon atoms (for example, —$C_4H_9$, 2,4,4-trimethylpentyl), and R' and R" each represents an alkyl group having from 1 to 5 carbon atoms (for example, methyl, ethyl, t-butyl).

Exemplary examples of the compounds represented by the formula (A) are shown below. However, the invention is not limited thereto.

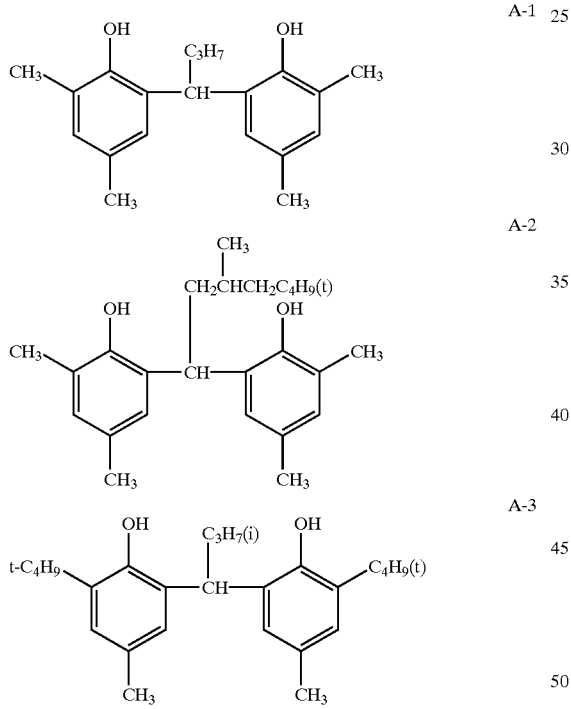

The used amount of reducing agents represented by the above-mentioned general formula (A) is preferably between $1 \times 10^{-2}$ and 10 moles, and is more preferably between $1 \times 10^{-2}$ and 1.5 moles per mole of silver.

The planographic printing plate material of the invention preferably contains, in addition to the foregoing components, an additive, which is called an image toning agent, color tone providing agent or activator toner (hereinafter, called an image toning agent). The image toning agent participates in oxidation-reduction reaction of an organic silver salt with a reducing agent, having a function of increasing density of the formed silver image, particularly making the image black. Examples of preferred image toning agents are disclosed in Research Disclosure Item 17029, and include the following:

imides (for example, phthalimide), cyclic imides, pyrazoline-5-one, and quinazolinone (for example, succinimide, 3-phenyl-2-pyrazoline-5-on, 1-phenylurazole, quinazoline and 2,4-thiazolidione); naphthalimides (for example, N-hydroxy-1,8-naphthalimide); cobalt complexes (for example, cobalt hexaminetrifluoroacetate), mercaptans (for example, 3-mercapto-1,2,4-triazole); N-(aminomethyl) aryldicarboxyimides [for example, N-(dimethylaminomethyl)phthalimide]; blocked pyrazoles, isothiuronium derivatives and combinations of certain types of light-bleaching agents (for example, combination of N,N'-hexamethylene(1-carbamoyl-3,5-dimethylpyrazole), 1,8-(3,6-dioxaoctane)bis-(isothiuroniumtrifluoroacetate), and 2-(tribromomethyl-sulfonyl)benzothiazole; merocyanine dyes (for example, 3-ethyl-5-((3-etyl-2-benzothiazolinylidene-(benzothiazolinylidene))-1-methylethylidene-2-thio-2,4-oxazolidinedione); phthalazinone, phthalazinone derivatives or metal salts thereof (for example, 4-(1-naphthyl)phthalazinone, 6-chlorophthalazinone, 5,7-dimethylphthalazinone, and 2,3-dihydro-1,4-phthalazinedione); combinations of phthalazinone and sulfinic acid derivatives (for example, 6-chlorophthalazinone and benzenesulfinic acid sodium, or 8-methylphthalazinone and p-trisulfonic acid sodium); combinations of phthalazine and phthalic acid; combinations of phthalazine (including phthalazine addition products) with at least one compound selected from maleic acid anhydride, and phthalic acid, 2,3-naphthalenedicarboxylic acid or o-phenylenic acid derivatives and anhydrides thereof (for example, phthalic acid, 4-methylphthalic acid, 4-nitrophthalic acid, and tetrachlorophthalic acid anhydride); quinazolinediones, benzoxazine, naphthoxazine derivatives, benzoxazine-2,4-diones (for example, 1,3-benzoxazine-2,4-dione); pyrimidines and asymmetry-triazines (for example, 2,4-dihydroxypyrimidine), and tetraazapentalene derivatives (for example, 3,6-dimercapto-1,4-diphenyl-1H, 4H-2,3a,5,6a-tatraazapentalene). Preferred image color control agents include phthalazone or phthalazine.

In the planographic printing plate material used in this invention, spectral sensitizing dyes are employed, as described in JP-A No. 63-159841, 60-140335, 63-231437, 63-259651, 63-304242, 63-15245; U.S. Pat. Nos. 4,639,414, 4,740,455, 4,741,966, 4,751,175, and 4,835,096. Useful sensitizing dye in this invention are also described in RD17643, IV-A (page 23, December, 1978) and ibid 1831X (page 437, August, 1978). Specifically, sensitizing dyes exhibiting sensitivity suitable for spectral characteristics of various scanner light sources can be advantageously selected, as described in JP-A No. 9-34078, 9-54409 and 9-80679.

In cases when being super-sensitized, and specifically when a reducing agent is not deactivated, photosensitivity is enhanced, print-out is easily promoted after development. In such a case, the present invention is effective. In cases when being infrared-sensitized, an infrared sensitizing dye has an oxidation-reduction potential at which a silver halide or an organic silver salt is slightly reducible, easily producing a silver cluster forming fog silver in the presence of the reducing agent, even when placed in a dark room. The produced silver cluster also induces fogging as a catalyst nucleus, deteriorating storage stability in the dark room or promoting print-out when placed in a daylight room after development. Further, sensitivity of the infrared sensitive material extends to the thermal radiation region outside the visible region so that the present invention is effective for inhibiting print-out silver produced by thermal radiation. Such an effect is marked in infrared-sensitized planographic printing plate material which is sensitized with a supersensitizer.

These sensitizing dyes may be used singly or in combination thereof. The dye combination is often used for supersensitization. In addition to sensitizing dyes, the silver halide emulsion may contain dyes, which do not provide spectral sensitivity, or materials, which do not substantially absorb visible light but exhibit supersensitization. Useful sensitizing dyes, dye combinations exhibiting supersensitization, and materials exhibiting supersensitization are described in RD17643 (published in December, 1978), IV-J at page 23, JP-B 9-25500 and 43-4933 (herein, the term, JP-B means published Japanese Patent) and JP-A 59-19032, 59-192242 and 5-341432.

In the invention, a -substituted aromatic heterocyclic compound represented by the following formula (4) is preferred as a supersensitizer:

Ar—SM     formula (4)

wherein M is a hydrogen atom or an alkali metal atom; Ar is an aromatic ring or condensed aromatic ring containing a nitrogen atom, oxygen atom, sulfur atom, selenium atom or tellurium atom. Such aromatic heterocyclic rings are preferably benzimidazole, naphthoimidazole, benzothiazole, naphthothiazole, benzoxazole, naphthooxazole, benzoselenazole, benzotellurazole, imidazole, oxazole, pyrazole, triazole, triazines, pyrimidine, pyridazine, pyrazine, pyridine, purine, quinoline, and quinazoline.

A disulfide compound, which is capable of producing a mercapto compound when incorporated into a dispersion of an organic silver salt and/or a silver halide grain emulsion is also included in the invention. In particular, a preferred example thereof is a disulfide compound represented by the following formula (5):

Ar—S—S—Ar     formula (5)

wherein Ar is the same as defined in formula (4). The aromatic heterocyclic rings described above may be substituted with a halogen atom (e.g., Cl, Br, I), a hydroxy group, an amino group, a carboxyl group, an alkyl group (having one or more carbon atoms, and preferably 1 to 4 carbon atoms) or an alkoxy group (having one or more carbon atoms, and preferably 1 to 4 carbon atoms).

Exemplary examples of the mercapto-substituted aromatic heterocyclic compound are shown below but are not limited to these.

M-1: 2-mercaptobenzimidazole
M-2: 2-mercaptobenzoxazole
M-3: 2-mercaptobenzthiazole
M-4: 5-methyl-2-mercaptobenzimidazole
M-5: 6-ethoxy-2-mercaptobenzthiazole
M-6: 2,2'-dithiobis (benzthiazole)
M-7: 3-mercapto-1,2,4-triazole
M-8: 4, 5-diphenyl-2-imidazole
M-9: 2- mercaptoimidazole
M-10: 1-ethyl-2-mercaptobenzimidazole
M-11: 2-mercaptoquinoline
M-12: 8-mercaptopurine
M-13: 2-mercapto-4(3H)-quinazoline
M-14: 7-trifluoromethyl-4-quinolinethiol
M-15: 2,3,5,6-tetrachloro-4-pyridinethiol
M-16: 4-amino-6-hydroxy-2-mercaptopyridine monohydrate
M-17: 2-amino-5-mercapto-1,3,4-thiazole
M-18: 3-amino-5-mercapto-1,2,4-triazole
M-19: 4-hydroxy-2-mercaptopyridine
M-20: 2-mercaptopyridine
M-21: 4,6-diamino-2-mercaptopyridine
M-22: 2-mercapto-4-methylpyrimidine hydrochloride
M-23: 3-mercapto-5-phenyl-1,2,4-riazole
M-24: 2-mercapto-4-phenyloxazole The supersensitizer compound usable in the invention is incorporated into an emulsion layer containing the organic silver salt and silver halide grains, preferably in an amount of 0.00 to 1.0 mol, and more preferably 0.01 to 0.5 mol per mol of silver.

Antifoggants may be incorporated into the planographic printing plate material to which the present invention is applied. is a mercury ion. However, mercury compounds known as the most effective, which are disclosed, for example, in U.S. Pat. No. 3,589,903 are not environmentally preferred. Therefore, mercury-free antifoggants have been sought. As the mercury-free antifoggants, preferred are those antifoggants as disclosed in U.S. Pat. Nos. 4,546,075 and 4,452,885, and JP-A No. 59-57234.

To improve variation in density after storage, in this invention, oxidizing agents are employed which reduce fogging after development. As such an oxidizing agent employed are compounds described in JP-A No. 50-119642, 50-120328, 51-121332, 54-58022, 56-70543, 56-99335, 59-90842, 61-129642, 62-129845, 6-208191, 7-5621, 7-2781, 8-15809; U.S. Pat. Nos. 5,340,712, 5,369,000, 5,464,737, 3,874,946, 4,756,999, 5,340,712; European Patent No. 605,981A1, 622,666A1, 631,176A1; JP-B No. 54-165; JP-A No. 7-2781; U.S. Pat. Nos. 4,180,665 and 4,442,202. Specifically, a polyhalogenated compound represented by the following formula (I) is preferred:

formula (I)

$$A—(Y)_n—\underset{X_2}{\overset{X_1}{\underset{|}{\overset{|}{C}}}}—X_3$$

wherein A represents an aliphatic group, an aromatic group, or a heterocyclic group; $X_1$, $X_2$ and $X_3$ independently represent a hydrogen atom or an electron-withdrawing group, which may be the same as or different from each other; provided that $X_1$, $X_2$ and $X_3$ are not simultaneously hydrogen atoms; Y represents a bivalent linkage group; and n is 0 or 1.

The electron-withdrawing group represented by $X_1$, $X_2$ and $X_3$ is a group exhibiting a σp value of preferably not less than 0.01 and more preferably not less than 0.1. Hammett substituent constant (σp) is detailed in Journal of Medicinal Chemistry, 1973, Vol. 16, No. 11, 1207 to 1216.

Examples of the electron-withdrawing group include a halogen atom [e.g., a fluorine atom (σp of 0.23), an iodine atom (σp of 0.23), a bromine atom (σp of 0.18), a trihalomethyl group [e.g., tribromomethyl (σp of 0.29), trichloromethyl (σp of 0.33), trifluoeomethyl (σp of 0.54)], a cyano group (σp of 0.66), a nitro group (σp of 0.78), an aliphatic, aryl or heterocyclic acyl group [e.g., acetyl (σp of 0.50), benzoyl (σp of 0.43)], an alkynyl group [e.g., $C_3H_3$ (σp of 0.09)], an aliphatic, aryl or heterocyclic oxycarbonyl group [e.g., methoxycarbonyl (σp of 0.45), phenoxycarbonyl (σp of 0.45)], a carbamoyl group (σp of 0.36), and a sulfamoyl group (σp of 0.57).

$X_1$, $X_2$ and $X_3$ are each preferably an electron-withdrawing group, and more preferably a halogen atom [e.g., fluorine atom ($\sigma p$ of 0.23), iodine atom ($\sigma p$ of 0.23), bromine atom ($\sigma p$ of 0.18), a trihalomethyl group [e.g., tribromomethyl ($\sigma p$ of 0.29), trichloromethyl ($\sigma p$ of 0.33), trifluoeomethyl ($\sigma p$ of 0.54)], cyano group ($\sigma p$ of 0.66), nitro group ($\sigma p$ of 0.78), aliphatic, aryl or heterocyclic acyl group [e.g., acetyl ($\sigma p$ of 0.50), benzoyl ($\sigma p$ of 0.43)], an alkynyl group [e.g., $C_3H_3$ ($\sigma p$ of 0.09)], an aliphatic, aryl or heterocyclic oxycarbonyl group [e.g., methoxycarbonyl ($\sigma p$ of 0.45), phenoxycarbonyl ($\sigma p$ of 0.45)], a carbamoyl group ($\sigma p$ of 0.36), and a sulfamoyl group ($\sigma p$ of 0.57); and still more preferably a halogen atom. Of halogen atoms, a chlorine atom, a bromine atom and an iodine atom are preferred and a chlorine atom and a bromine atom are more preferred, and a bromine atom is still more preferred.

Y is a bivalent linkage group and examples thereof include $-SO_2-$, $-SO-$, $-CO-$, $-N(R_{101})-SO_2-$, $-N(R_{101})-CO-$, $-N(R_{101})-COO-$, $-COCO-$, $-COO-$, $-OCO-$, $-OCOO-$, $-SCO-$, $-SCOO-$, $-C(Z_{11})(Z_{12})-$, alkylene, arylene, a bivalent heterocyclic group and a bivalent linkage groups formed by the combination of these groups. $R_{101}$ is a hydrogen atom or an alkyl group, and preferably a hydrogen atom. $Z_{11}$ and $Z_{12}$ each are a hydrogen atom or an electron withdrawing group, provided that both of them are not hydrogen atoms at the same time and the electron-withdrawing group preferably is a group exhibiting a Hammett substituent constant ($\sigma p$) of not less than 0.01, and more preferably not less than 0.1. Preferred electron-withdrawing groups of $Z_{11}$ and $Z_{12}$ are the same as those of $X_1$, $X_2$ and $X_3$.

$Z_{11}$ and $Z_{12}$ are preferably a halogen atom, cyano, or nitro. The halogen atom is preferably a chlorine atom, a bromine atom and an iodine atom, more preferably a chlorine or bromine atom, and still more preferably a bromine atom. Y is preferably $-SO_2-$, $-SO-$ or $-CO-$, and more preferably $-SO_2-$; and n is preferably 1.

The aliphatic group represented by A is a straight-chain, branched or cyclic alkyl group (preferably having 1 to 30 carbon atoms, more preferably 1 to 20 carbon atoms, and still more preferably 1 to 12 carbon atoms, such as methyl, ethyl, iso-propyl, tert-butyl, n-octyl, n-decyl, cyclopropyl, cyclopentyl and cyclohexyl), an alkenyl group (preferably having 2 to 30 carbon atoms, more preferably 2 to 20 carbon atoms, and still more preferably 2 to 12 carbon atoms, such as vinyl, allyl, 2-butenyl, 3-pentenyl), an alkynyl group (preferably having 2 to 30 carbon atoms, more preferably 2 to 20 carbon atoms, and still more preferably 2 to 12 carbon atoms, such as propargyl, 3-pentynyl), each of which may be substituted. Examples of the substituent group include a carboxyl group, an acyl group, an acylamino group, a sulfonylamino group, a carbamoyl group, an oxycarbonylamino group, and an ureido group. The aliphatic group is preferably an alkyl group, and more preferably a chained alkyl group. The aromatic group represented by A is preferably an aryl group; the aryl group is preferably monocyclic or di-cyclic aryl group having 6 to 30 carbon atoms (e.g., phenyl, naphthyl), more preferably an aryl group having 6 to 20 carbon atoms, and still more preferably an aryl group having 6 to 12 carbon atoms. The aryl group may be substituted and examples of the substituent group include a carboxy group, an acyl group, an acylamino group, a sulfonylamino group, a carbamoyl group, an oxycarbonylamino group, and a ureido group.

The heterocyclic group represented by A is preferably a 5- or 6-member aromatic heterocyclic group, more preferably a 5- or 6-member aromatic heterocyclic group containing a nitrogen atom, and still more preferably a 5- or 6-member aromatic heterocyclic group containing one or two nitrogen atoms. Examples of the heterocyclic group include pyrrolidine, piperidine, piperadine, morpholine, thiophene, furan, pyrrole, imidazole, pyrazolo, pyridine, pirazine, pyridazine, triazole, triazine, indole, indazole, purine, thiadiazole, oxadiazole, quinoline, phthalazine, naphthylidine, quinoquixaline, quinazolone, cinnoline, puteridine, acridine, phenazine, tetrazole, thiazole, oxazole, benzimidazole, benzoxazole, benzthiazole, and indolenine. Of these, thiophene, furan, pyrrole, imidazole, pyrazolo, pyridine, pyrazine, pyridazine, triazole, trazine, indole, indazole, quinoline, thiadiazole, oxadiazole, phthalazine, naphthylidine, quinoxaline, quinazolone, cinnolinepteridine, tetrazole, thiazole, oxazole, benzimidazole, benzoxazole, benzthiazole, and indolenine are preferred; pyridine, triazine, quinoline, thiadizole, benzthiazole, and oxadiazole are more preferred; and pyridine, quinoline, thiadiazole and oxadiazole are still more preferred.

Of the foregoing polyhalogenated compounds, a compound represented by the following formula (I-a) are more preferred:

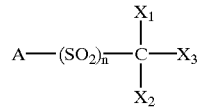

formula (I-a)

wherein A, $X_1$, $X_2$, X3 and n are the same as defined in formula (I), and the preferred range is also the same as defined in formula (I).

Exemplary examples of the polyhalogenated compounds are shown below bur are by no means limited to these.

O-1

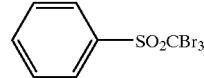

O-2

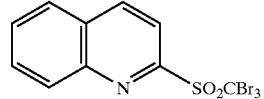

O-3

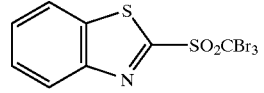

O-4

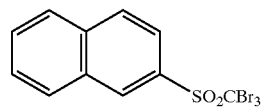

O-5

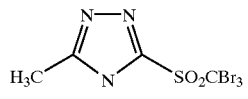

O-6

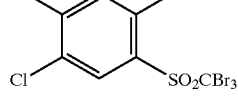

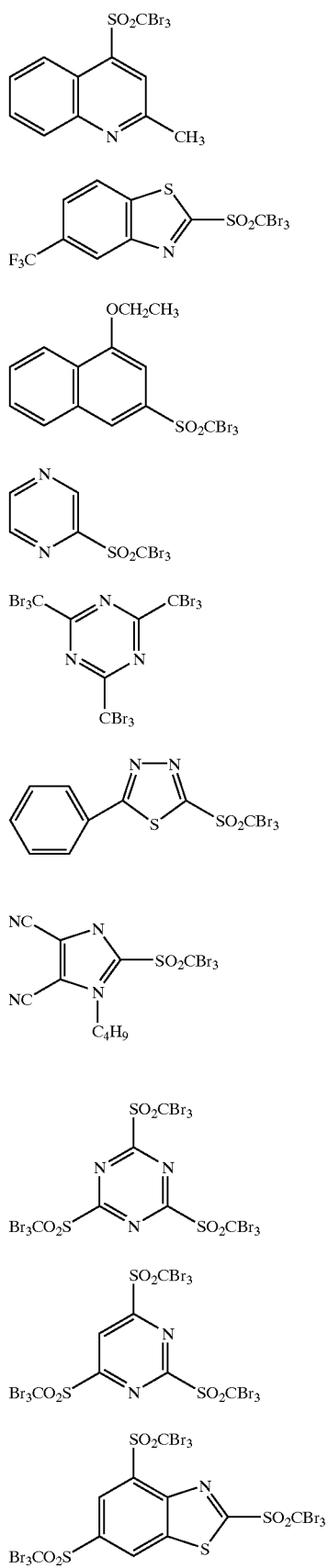
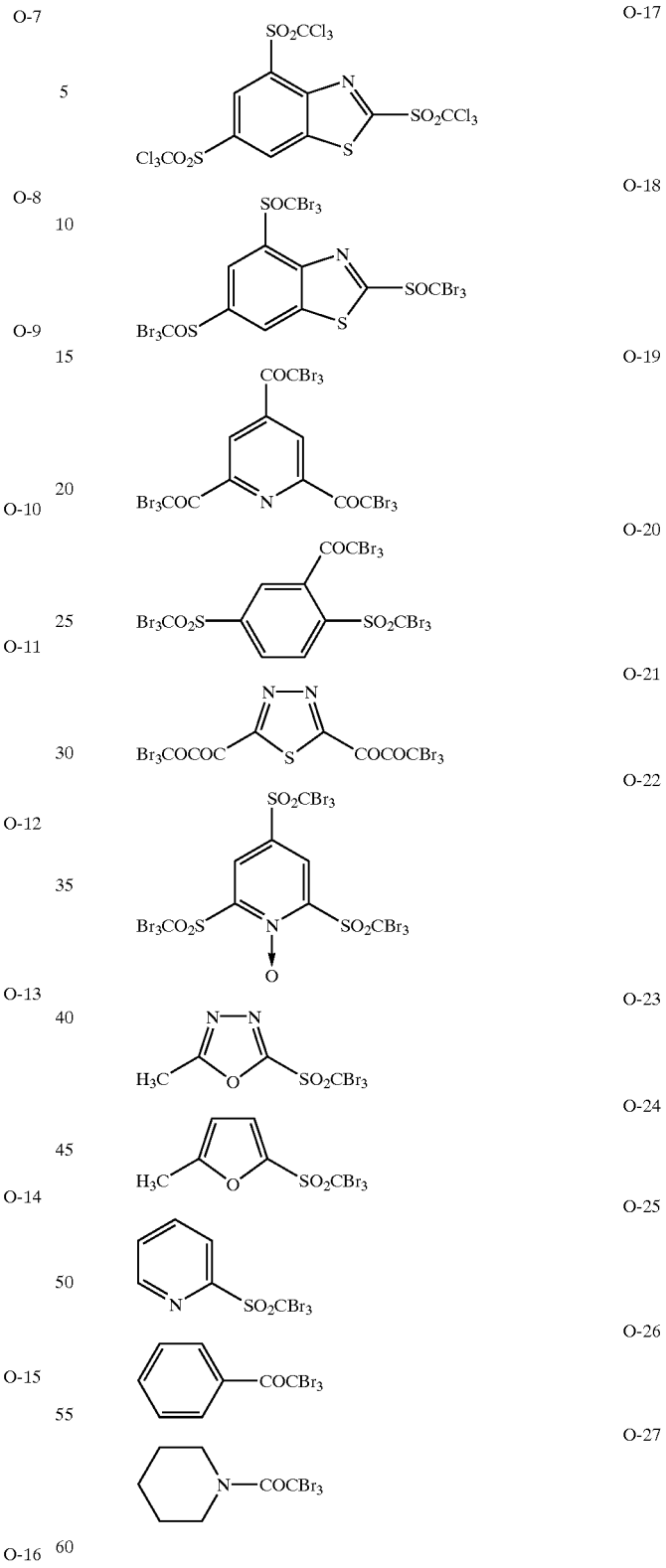
In this invention the foregoing oxidizing agent is incorporated preferably in an amount of from 10 mg/m$^2$ to 3 g/m$^2$, and more preferably from 50 mg/m$^2$ to 1 g/m$^2$. The oxidizing agent may be incorporated in any form, such as a solution, powder, or a solid particle dispersion, and is preferably incorporated into the light sensitive layer in the form of a solid particle dispersion. A dispersing aid may be used in its dispersion. It may be incorporated in the form a solution, together with other additives such as sensitizing dye, reducing agent, or image toning agent.

Besides the foregoing oxidizing agent, suitable antifoggants are employed, including compounds described in U.S. Pat. Nos. 3,874,946 and 4,756,999; compounds described in JP-A No. 9-288328, column [0030] to [0036], compounds described in JP-A No. 9-90550, column [0062] to [0063], and compounds described in U.S. Pat. No. 5,028,523, European Patent No. 600,587, 631,176 and 605,981.

Binders suitable for the planographic printing plate material to which the present invention is applied are transparent or translucent, and generally colorless. Binders are natural polymers, synthetic resins, and polymers and copolymers, other film forming media; for example, gelatin, gum arabic, poly(vinyl alcohol), hydroxyethyl cellulose, cellulose acetate, cellulose acetatebutylate, poly(vinyl pyrrolidone), casein, starch, poly(acrylic acid), poly(methyl methacrylic acid), poly(vinyl chloride), poly(methacrylic acid), copoly (styrene-maleic acid anhydride), copoly(styrene-acrylonitrile, copoly(styrene-butadiene, poly(vinyl acetal) series [e.g., poly(vinyl formal)and poly(vinyl butyral), polyester series, polyurethane series, phenoxy resins, poly (vinylidene chloride), polyepoxide series, polycarbonate series, poly(vinyl acetate) series, cellulose esters, poly (amide) series. The binders used in the planographic printing plate material may be any of a hydrophobic resin and a hydrophilic resin, but in order to reduce fog after thermal development, a hydrophobic resin is preferably used. Examples of the hydrophobic resin include polyvinyl butyral, cellulose acetate, cellulose acetate butyrate, polyester, polycarbonate, polyacrylic acid, and polyurethane. Of these, polyvinylbutyral, cellulose acetate resin, cellulose acetate-butyrate resin, and polyester are especially preferred.

Another preferred binder in this invention is a polymer latex described later. Such a polymer latex is preferably contained in the light sensitive layer. The content of the polymer latex is preferably 50% by weight or more, based on the total binder. Herein, the polymeric latex is a water-insoluble polymeric material which is dispersed in an aqueous dispersing medium in the form of fine solid particles. The dispersion form thereof may be any one of a form in which a polymer is emulsified in a dispersing medium, a form of being emulsion-polymerized, being dispersed in the form of a micell and a form in which a polymer has a hydrophilic partial structure and its molecular chain is in the form of a molecular dispersion.

The polymer latexes are described in "Synthetic Resin Emulsion" (edited by T. Okuda and h. Inagaki, published by KOBUNSHI-KANKOKAI, 1978), "Application of Synthetic Latex" (edited by Sugimura et al., published by KOBUNSHI-KANKOKAI, 1993), and "Chemistry of Synthetic Latex" (S. Muroi, published by KOBUNSHI-KANKOKAI, 1970).

The mean particle size of dispersing particles is preferably 1 to 50,000 nm, and more preferably 5 to 1,000 nm. The particle size distribution thereof is not specifically limited and may be polydisperse or monodisperse. The polymer latexes used in the invention may be those having a uniform structure as well as core/shell type latexes. In this case, it is sometimes preferred that the glass transition temperature is different between the core and shell. The minimum forming (or tarnishing) temperature (MFT) of the polymer latexes is preferably 30 to 90° C., and more preferably 0 to 70° C. A tarnishing aid is also called a plasticizer, which is an organic compound (conventionally, an organic solvent) capable of lowering the MFT of a polymer latex and described in "Chemistry of Synthetic Latex" (S. Muroi, published by KOBUNSHI-KANKOKAI, 1970).

Polymers used for polymer latexes include acryl resin, vinyl acetate resin, polyester resin, polyurethane resin, rubber type resin, vinyl chloride resin, vinylidene chloride resin, polyolefin resin and their copolymers. Polymers may be a straight-chained polymer or branched polymer, or a cross-linked polymer, including homopolymers and copolymers. The copolymer may be a random copolymer or a block copolymer. The number-averaged molecular weight of the copolymer is preferably 5,000 to 1000,000, and more preferably 10,000 to 100,000. In cases where the molecular weight is excessively small, mechanical strength of a light sensitive layer is insufficient, excessively large molecular weight results in deterioration in film forming property.

Exemplary examples of polymer latexes used as a binder of the light sensitive layer of the planographic printing plate material of the invention include a latex of methylmethacrylate/ethylmethacrylate/methacrylic acid copolymer, a latex of methylmethacrylate/2-ethylhexylacrylate/styrene/acrylic acid copolymer, a latex of styrene/butadiene/acrylic acid copolymer, a latex of styrene/butadiene/divinylbenzene/methacrylic acid copolymer, a latex of methylmethacrylate/vinyl chloride/acrylic acid copolymer, and a latex of vinylidene chloride/ethylacrylate/acrylonitrile/methacrylic acid copolymer.

Such polymers are commercially available, and examples of commercially available acryl resin include Sevian A-4635, 46583, and 4601 (available from DAISEL CHEMICAL Ind. Ltd.)Nipol Lx811, 814, 821, 820, and 857 (available from NIHON ZEON Co. Ltd. Examples of polyester rein include FINETEX ES650, 611, 675, 850 (available from DAINIPPON INK CHEMICAL Co. Ltd.), and WD-size WMS (available from Eastman Kodak Corp.). Examples of polyurethane resin include HYDRAN AP10, 20, 30, 40 (available from DAINIPPON INK CHEMICAL Co. Ltd.). Examples of rubber resin include LACSTAR 7310K, 3307, 4700H, 7132C (available from DAINIPPON INK CHEMICAL Co. Ltd.); and Nipol Lx416, 410, 438C and 2507 (available from NIHON ZEON Co. Ltd.). Examples of vinylidene chloride resin include L502, L513 (available from ASAHI CHEMICAL IND. Co. Ltd.). Examples of olefin resin include CHEMIPAL S120, SA100 (available from MITSUI PETROLEUM CHEMICAL IND. Co. Ltd.). These polymers can be used alone or may be blended.

Polymer species of the polymer latex are preferably those containing 0.1 to 10% by weight of a carboxylic acid component, such as acrylate or methacrylate. In cases where a polymer latex is incorporated in the light sensitive layer, the polymeric latex preferably accounts for at least 50% by weight, and more preferably at least 70% by weight, based on the binder contained in the light sensitive layer. In that case, not more than 50% by weight of the whole binder of the light sensitive layer may be accounted for by a hydrophilic polymer such as gelatin polyvinyl alcohol, methyl cellulose, hydroxypropyl cellulose, carboxymethyl cellulose, or hydroxypropykmethyl cellulose. The amount of these polymers is preferably not more than 30% by weight of the whole binder.

In case when the polymer latex is used in the light sensitive layer, it is preferred that an aqueous-type coating solution is coated and dried to form the light sensitive layer. Herein, the expression "aqueous-type" means that at least 50% (preferably at least 65%) by weight of a solvent (dispersing medium) used in the coating solution is water. The solvent(s) contained in the coating solution other than water include, for example, water-miscible organic solvents, such as methanol, ethanol, isopropanol, methyl cellosolve, ethyl cellosolve, dimethyl formamide and ethyl acetate. Examples of the solvent composition include water/methanol (90/10), water/methanol (70/30), water/ethanol (90/10), water/isopropanol (90/10), water/dimethyl formamide (95/5), water/methanol/dimethyl formamide (80/15/5), and water/methanol/dimethyl formamide (90/5/5), wherein the number means weight percentage.

There may be incorporated to the light sensitive layer a cross-linking agent for cross-linking or a surfactant to improve coating property. When the light sensitive layer contains a polymer latex, the coating solution of the light sensitive layer is preferably a thixotropy fluid. Herein the thixotropy indicates a property in which the viscosity is lowered with increasing the shear rate. The viscosity can be measured by any instrument, and preferably using FRS Fluid Spectrometer (available from Rheometrics Far East Corp.), at a temperature of 25° C. In an organic silver salt-containing liquid or a light sensitive layer coating solution in the invention, the viscosity is preferably from 400 mPa·s to 100,000 mPa·s, and more preferably from 500 mPa·s to 20,000 mPa·s at a shear rate of 0.1/sec. Further, the viscosity is preferably from 1 mPa·s to 200 mPa·s, and more preferably from 5 mPa·s to 80 mPa·s at a shear rate of 1,000/sec.

There are known various systems exhibiting thixotropy, as described in "Series Rheology" edited by KOBUNSHI-KANKOKAI; and "Polymer Latex" (Muroi & Morino, published by KOBUNSHI-KANKOKAI). To allow the liquid to display thixotropy, it is necessary to contain a large amount of fine solid particles. Further, incorporation of a viscosity-increasing linear polymer, the fine solid particles exhibiting anisotropy and having a large aspect ratio, viscosity increasing with alkali or the use of a surfactant is also effective to enhance the thixotropy.

The total amount of the binder used in the light sensitive layer is 0.2 to 30 g/m$^2$, and preferably 1 to 15 g/m$^2$.

There can be provided a light insensitive layer on the outer side of the light sensitive layer to protect the surface of the planographic printing plate material or prevent it from abrasion. Binders used in the light-insensitive layer may be the same with or different from those used in the light sensitive layer.

The binder amount in the light sensitive layer is preferably 0.5 to 30 g/m$^2$, and more preferably 1 to 15 g/m$^2$ to enhance thermal developing speed. In the case of less than 0.5 g/m$^2$, the density of unexposed areas sometimes markedly increases to a level unacceptable to practical use.

It is preferred to incorporate a matting agent to the light sensitive layer side. Thus, it is preferred to allow a matting agent to exist on the surface of the planographic printing plate material to prevent images formed after thermal processing from abrasion. The amount of the matting agent is preferably 0.5 to 30% by weight, based on the whole binder of the light sensitive layer side. In cases where at least a non-light sensitive layer is provided on the side opposite to the light sensitive layer, the non-light sensitive layer preferably contains a matting agent. The matting agent may be either regular form or irregular form, and preferably is a regular form and a spherical form is more preferred.

In the planographic printing plate material used in this invention, a light sensitive layer alone may be provided on a support, but at least one light insensitive layer is preferably provided on the light sensitive layer. To control the amount or wavelength distribution of light passing through the light sensitive layer, there may be a filter dye layer on the light sensitive layer-side or an anti-halation dye layer, so-called backing layer on the opposite side. A dye or pigment may be incorporated to the light sensitive layer.

The light insensitive layer may contain the binder or matting agent described above, or lubricants such as polysiloxane compounds or liquid paraffin.

Various types of surfactants can be employed as a coating aid in the planographic printing plate material used in this invention. Specifically, fluorinated surfactants are preferably employed to improve an antistatic property or to prevent dot-like coating troubles.

An anti-halation layer is provided farther from the light sensitive layer with respect to a light source. The anti-halation layer preferably exhibits the maximum absorption of 0.1 to 2.0 within the intended wavelength region! and more preferably 0.2 to 1.5 of the absorption within the exposure wavelength region; the absorption after being processed is preferably not less than 0.01 and less than 0.2, and more preferably not less than 0.001 and less than 0.15, as a optical density of the layer. In cases where used in printing plate making, the layer exhibits preferably an optical density of not less than 0.001 and less than 0.2, and more preferably not less than 0.001 and less than 0.15 in the absorption at a wavelength of 400 nm.

Anti-halation dyes usable in this invention are any compound having desired absorption within the intended wavelength region and exhibiting sufficiently reduced absorption after being processed, thereby forming a desired absorption spectrum form.

Examples of the dyes include compounds described in JP-A 59-56458, 2-216140, 7-13295, 7-11432; U.S. Pat. No. 5,380,635; JP-A 2-6853 at page 13, lower left column line 1 to page 14, lower left column line 9, JP-A 3-24539 at page 14, lower left column to page 16, lower right column. Dyes capable of being decolorized on processing include, for example, compounds described in JP-A 52-139136, 53-132334, 56-501480, 57-16060, 57-68831, 57-101835, 59-182436, 7-36145, 7-199409; JP-B (hereinafter, the term, JP-B means published Japanese Patent) 48-33692, 5-16648, 2-41734; and U.S. Pat. Nos. 4,088,497, 4,283,487, 4,548,896, and 5,187,049.

The planographic printing plate material of the invention has at least one light sensitive layer on one side of the support, and may have a backing layer on the other side of the support.

Binders suited to the backing layer are transparent or translucent and, in general, colorless, including natural polymers, synthetic resin and polymers, and their copolymers. Examples thereof include gelatin, gum arabic, poly (vinyl alcohol), hydroxyethyl cellulose, cellulose acetate, cellulose butylate, poly(vinyl pyrrolidine), casein, starch, poly(acrylic acid), poly (methyl methacrylic acid), poly (vinyl chloride), poly(methacrylic acid), copoly(styrene-anhydrous maleic acid), copoly(styrene-acrylonitrile), copoly(styrene-butadiene), poly(vinyl acetal)s such as poly (vinyl formal), poly(vinyl butyral), polyesters, polyurethanes, phenoxy resin, poly (vinilidene chloride), polyexpoxides, polycarbonates, poly(vinyl acetate), cellulose esters, and polyamides. Binders may be cover-coated using water, an organic solvent or an emulsion.

The backing layer preferably exhibits the maximum absorption of 0.3 to 2.0 within the intended wavelength region, and more preferably 0.5 to 2 of the absorption within the exposure wavelength region; the absorption after being processed is preferably not less than 0.01 and less than 0.5, and more preferably not less than 0.001 and less than 0.3, as a optical density of the layer. In cases where used in printing plate making, the layer exhibits preferably an optical density of not less than 0.001 and less than 0.2, and more preferably not less than 0.001 and less than 0.15 in the absorption at a wavelength of 400 nm. Examples of anti-halation dyes used in the backing layer are the same as cited in the anti-halation layer afore-mentioned.

Various additives may be incorporated to any one of the light sensitive layer, light insensitive layer and other layers. There may be employed a surfactant, antioxidant, stabilizer, plasticizer, UV absorbent, and coating aid in the photothermographic material. As these additives and other adjuvants are usable compounds described in Research Disclosure (also denoted as RD) 17029 (June, 1978, pages 9–15).

As the support in the invention, those well known in the art as supports for printing plates can be used. Examples of the support include a metal plate, a plastic film, paper treated with polyolefin, and composite materials such as laminates thereof. The thickness of the support is not specifically limited as long as a printing plate having the support can be mounted on a printing press, and is advantageously from 50 to 500 μm in easily handling.

Examples of the metal plate include iron, stainless steel, and aluminum. Aluminum is especially preferable in its gravity and stiffness. Aluminum is ordinarily used after degreased with an alkali, an acid or a solvent to remove oil on the surface, which has been used when rolled and wound around a spool. The degreasing is carried out preferably employing an aqueous alkali solution. In order to increase adhesion between the support and a coating layer, it is preferred that the surface of the support is subjected to adhesion increasing treatment or is coated with a subbing layer. For example, the support is immersed in a solution containing silicate or a coupling agent such as a silane coupling agent, or the support is coated with the solution and then sufficiently dried. Anodization treatment is considered to be one kind of adhesion increasing treatment, and can be used. The anodization treatment and the immersing or coating treatment described above can be combined. Aluminum plate, which is surface-roughened with a conventional method, can be used.

Examples of the plastic film include a polyethylene terephthalate film, a polyethylene naphthalate film, a polyimide film, a polyamide film, a polycarbonate film, a polysulfone film, a polyphenylene oxide film, and a cellulose ester film. The plastic film is preferably a polyethylene terephthalate film, or a polyethylene naphthalate film. In order to increase adhesion between the support and a coating layer, it is preferred that the surface of the plastic film is subjected to adhesion increasing treatment or is coated with a subbing layer. Examples of the adhesion increasing treatment include corona discharge treatment, flame treatment, plasma treatment and UV light irradiation treatment. The subbing layer include a layer containing gelatin or latex. As the subbing layer, a water impermeable layer such as polyvinydene chloride or an aluminum or silicon evaporated layer may be provided on the support surface. Further, the subbing layer described above may be provided on the evaporated layer.

The composite support can be obtained suitably laminating the above supports. Laminating may be carried out before or after forming a hydrophilic layer. Further, laminating may be carried out immediately before mounting it on a printing press.

When the plastic film is used as a support, it is preferred that the support is subjected to an annealing treatment under a relatively low tension to enhance its dimensional stability. For example, there may be optionally combined known techniques described in JP-B no. 60-22616, U.S. Pat. No. 2,779,684, Research disclosure No. 19809, JP-A Nos. 8-211547, 10-10676, 10-10677, 11-47676, 11-65025, 11-138628, 11-138648, 11-221892, 11-333922, and 11-333923. The tension applied to the support at the time of thermal treatment, and preferably at the time of sublayer coating is preferably 0.4 to 80 N/cm$^2$, more preferably 2 to 60 N/cm$^2$, and still more preferably 10 to 50 N/cm$^2$.

The planographic printing plate material of this invention may be exposed by any means and lasers are preferably employed as a light source. Preferred lasers usable in this invention include, for example, gas laser, YAG laser, dye laser and semiconductor laser. Specifically, longitudinal multiple exposure or an oblique exposure method is preferred to prevent interference fringes and unevenness of halftone dot exposure. The longitudinal multiple exposure is carried out using a laser scanning exposure apparatus emitting longitudinally multiple scanning laser light beams. The longitudinal multiplication is suitably carried out employing a technique of employing backing light with composing waves or a technique of high frequency overlapping, and a technique as described in JP-A 59-10964 is employed. The expression "longitudinally multiple" means that the exposure wavelength is not a single wavelength. The exposure wavelength distribution is usually not less than 5 nm and not more than 10 nm. The upper limit of the exposure wavelength distribution is not specifically limited but is usually about 60 nm. The oblique exposure is that exposure is made using a laser exposure apparatus, in which a scanning laser light is not exposed at an angle substantially vertical to the exposed surface of the photothermographic material, as described in JP-A 5-113548. The expression "laser light is not exposed at an angle substantially vertical to the exposed surface" means that laser light is exposed preferably at an angle of 55 to 88°, more preferably 60 to 86°, still more preferably 65 to 84°, and optimally 70 to 82°.

When the planographic printing plate material is scanned with laser light, the beam spot diameter on the surface of the material is preferably not more than 200 μm, and more preferably not more than 100 μm. Thus, a smaller spot diameter preferably reduces the angle displacing from verticality of the laser incident angle. The lower limit of the laser beam spot diameter is 5 μm. Exposure employing such a laser beam can minimize deterioration of image quality resulting from exposure unevenness such as interference fringe.

The planographic printing plate material may be thermally developed by any method, and the imagewise-exposed material is usually heated to thermally develop. The thermal development temperature is preferably 105 to 145° C., and more preferably 107 to 140° C. The thermal development time is preferably 1 to 180 sec., more preferably 7 to 50 sec., and still more preferably 8 to 25 sec.

As another thermal development, it is preferable that the material is thermally developed under the above conditions, and further thermally developed to carry out thermal transfer development. In this case, it is preferred that the thermal development temperature of the latter is higher, for example, 3 to 20° C. higher, than that of the former, and/or the thermal development time of the latter is longer, for example, 5 to 120 second longer than that of the former.

The planographic printing plate material of the invention is thermally developed preferably using a thermal processor. The planographic printing plate material is easily affected by the temperature variation of the heat-developing section of the processor, resulting in uneven development. There are employed a heated drum type automatic processor described in JP-A 9-297384, 9-297385 and 9-297386, and a planar-transport type automatic thermal processor described in WO 98/27458. The planographic printing plate materials are preferably processed employing a planer-transport type thermal processor to enhance dimensional stability. A thermal processor is preferably used, in which a pre-heating section is provided prior to the thermal development section and the preheating temperature is 80 to 120° C. The preheating promotes development and reduces unevenness in density, and also being effective in scanning unevenness. It is preferred that the planographic printing plate material is thermally developed using a thermal processor described in JP-A 11-133572, in which the planographic printing plate material is transported while one side of the planographic printing plate material is brought into contact with a fixed heating body and the other side is pressed to a heating body by plural rollers.

EXAMPLES

Embodiments of the present invention will be further described based on examples, but the invention is not limited thereto.

Example 1
Preparation of Planographic Printing Plate Material

Example 1
Preparation of Subbed PET Support

Both surfaces of a biaxially stretched thermally fixed 175 μm polyethylene terephthalate (hereinafter, also denoted simply as PET) film were subjected to a plasma treatment under the condition described below. Onto the surface of one side, the subbing coating composition a-1 described below was applied so as to form a dried layer thickness of 0.8 μm, which was then dried. The resulting coating was designated Subbing Layer A-1. Onto the opposite surface, the subbing coating composition b-1 described below was applied to form a dried layer thickness of 0.8 μm. The resulting coating was designated as Subbing Layer B-1.
Plasma Treatment Condition Using a batch type atmospheric plasma treatment apparatus (AP-1-H-340, available from E.C. Chemical Co., Ltd.), plasma treatment was conducted at a high frequency output of 4.5 kW and a frequency of 5 kHz over a period of 5 sec. in an atmosphere of argon, nitrogen and hydrogen in a ratio of 90%, 5% and 5% by volume, respectively.

| Subbing Coating Composition a-1 | |
|---|---|
| Latex solution (solid 30%) of a copolymer consisting of butyl acrylate (30 weight %), t-butyl acrylate (20 weight %) styrene (25 weight %) and 2-hydroxy ethyl acrylate (25 weight %) | 270 g |
| Hexamethylene-1,6-bis(ethyleneurea) | 0.8 g |
| Polystyrene fine particles (av. particle size, 3 μm) | 0.05 g |
| Colloidal silica (av. particle size, 90 μm) | 0.1 g |
| Water was added to make a 1 liter solution. | |
| Subbing Coating Composition b-1 | |
| Tin oxide doped with 0.1% by weight indium having an average particle size of 36 nm | 0.26 g/m$^2$ |
| Latex liquid (solid portion of 30%) of a copolymer consisting of butyl acrylate (30 weight %), styrene (20 weight %), and glycidyl acrylate (40 weight %) | 270 g |
| Hexamethylene-1,6-bis(ethyleneurea) | 0.8 g |
| Water was added to make a 1 liter solution. | |

Thermal Treatment of Support

The thus subbed support was heated at a temperature of 140° C. in the sublayer-drying process and gradually cooled, while being transported at a tension of 1×10$^5$ Pa.

Backing layer-side Coating

The following backing layer coating solution 1 and the following backing protective layer coating solution 1 were each filtered using a filter of a semi-absolute filtration accuracy of 20 μm, then, simultaneously coated on the antistatic subbing layer B-1 of the support prepared above at a coating speed of 120 m/min so as to form a total wet thickness of 30 μm, and dried at 60° C. for 4 min.

| Backing layer Coating Solution 1 | |
|---|---|
| Methyl ethyl ketone | 16.4 g/m$^2$ |
| Polyester resin (Vitel PE2200B, available from Bostic Co.) | 106 mg/m$^2$ |
| Cellulose acetate-propionate (CAP504-0.2, available from Eastman Chemical Co.) | 1.0 g/m$^2$ |
| Cellulose acetate-butylate (CAB381-20, available from Eastman Chemical Co.) | 1.0 g/m$^2$ |
| Backing Protective Layer Coating Solution 1 | |
| Methyl ethyl ketone | 22 g/m$^2$ |
| Polyester resin (Vitel PE2200B, available from Bostic Co.) | 106 mg/m$^2$ |
| Antistatic agent (CH$_3$)$_3$SiO—[(CH$_3$)$_2$SiO]$_{20}$— {CH$_3$SiO[CH$_2$CH$_2$CH$_2$O(CH$_2$CH$_2$O)$_{10}$— (CH$_2$CH$_2$CH$_2$O)$_{15}$CH$_3$]}$_{30}$—Si(CH$_3$)$_3$ | 22 mg/m$^2$ |
| Fluorine-containing surfactant F-1: C$_8$F$_{17}$SO$_3$Li | 10 mg/m$^2$ |
| Cellulose acetate-propionate (CAP504-0.2, available from Eastman Chemical Co.) | 1.0 g/m$^2$ |
| Cellulose acetate-butylate (CAB381-20, available from Eastman Chemical Co.) | 1.0 g/m$^2$ |
| Matting agent (SILOID74, av. particle size of 7 μm, available from Fuji-Davison Co.) | 17 mg/m$^2$ |
| (Preparation of Light Sensitive Layer) | |

-continued

| Anti-halation Layer Coating Solution 1 | |
|---|---|
| Methyl ethyl ketone | 10.4 g/m² |
| Polyester resin (Vitel PE2200B, available from Bostic Co.) | 100 mg/m² |
| Infrared dye-C | 37 mg/m² |
| Stabilizing agent B-1 (Sumirizer BPA, available from Sumitomo Chemical Co., Ltd.) | 20 mg/m² |
| Stabilizing agent B-2 (Tomisoap 77, available from Yoshitomi Seiyaku Co., Ltd.) | 20 mg/m² |
| Cellulose acetate-propionate (CAP504-0.2, available from Eastman Chemical Co.) | 0.5 g/m² |
| Cellulose acetate-butylate (CAB381-20, available from Eastman Chemical Co.) | 0.5 g/m² |
| Polyvinyl butyral (Butvar B-79, available from Monsanto Co., Ltd.) | 0.5 g/m² |

Infrared dye-C

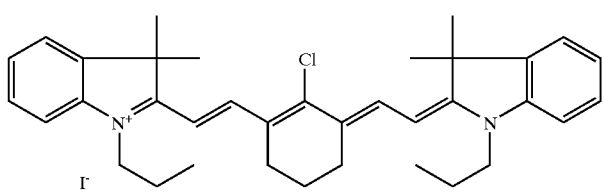

Stabilizing agent B-1

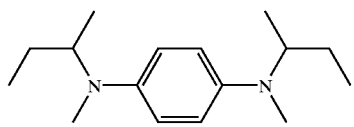

Stabilizing agent B-2

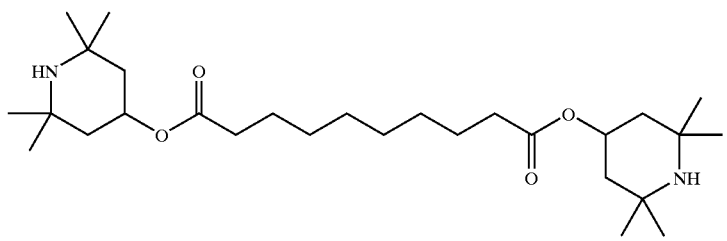

Preparation of Light-sensitive
Silver Halide Emulsion A
Solution A1

| Phenylcarbamoyl gelatin | 88.3 g |
|---|---|
| Compound (A) (10% methanol solution) | 10 ml |
| Potassium bromide | 0.32 g |
| Water to make | 5429 ml |

Solution B1

| 0.67 mol/l Aqueous silver nitrate solution | 2635 ml |
|---|---|

Solution C1

| Potassium bromide | 51.55 g |
|---|---|
| Potassium iodide | 1.47 g |
| Water to make | 660 ml |

Solution D1

| Potassium bromide | 154.9 g |
|---|---|
| Potassium iodide | 4.41 g |
| Iridium chloride (1% solution) | 0.93 ml |

Solution E1

| 0.4 mol/l aqueous potassium bromide solution | Amount necessary to adjust silver potential |
|---|---|

-continued

Solution F1

| | |
|---|---|
| Aqueous 56% acetic acid solution | 16.0 ml |

Solution G1

| | |
|---|---|
| Anhydrous sodium carbonate | 1.72 g |
| Water to make | 151 ml |
| Compound (A): $HO(CH_2CH_2O)_n$—$(CH(CH_3)CH_2O)_{17}$—$(CH_2CH_2O)_mH$ (m + n = 5 to 7) | |

Using a stirring mixer described in JP-B 58-58288 and 58-58289, ¼ of solution B1, the total amount of solution C1 were added to solution $A_1$ by the double jet addition for 4 min 45 sec. to form nucleus grain, while maintaining a temperature of 45° C. and a pAg of 8.09.

After 7 min, ¾ of solution B1 and the total amount of solution D1 were further added by the double jet addition for 14 min 15 sec., while mainlining a temperature of 45° C. and a pAg of 8.09. During addition, pH of the reaction mixtuer was 5.6. Control of pAg was carried out by solution E1.

After stirring for 5 min., the reaction mixture was lowered to 40° C. and solution F1 was added thereto to coagulate the resulting silver halide emulsion. Remaining 2000 ml of precipitates, the supernatant was removed and after adding 10 lit. water with stirring, the silver halide emulsion was again coagulated. Remaining 1500 ml of precipitates, the supernatant was removed and after adding 10 lit. water with stirring, the silver halide emulsion was again coagulated. Remaining 1500 ml of precipitates, the supernatant was removed and solution Hi was added. The temperature was raised to 60° C. and stirring continued for 120 min. Finally, the pH was adjusted to 5.8 and water was added there to so that the weight per mol of silver was 1161 g.

It was proved that the resulting emulsion was comprised of monodisperse silver iodobromide cubic grains having an average grain size of 0.058 μm, a coefficient of variation of grain size of 12% and a [100] face ratio of 92%.

Preparation of Powdery Organic Silver Salt A

Behenic acid of 130.8 g, arachidic acid of 67.7 g, stearic acid of 43.6 g and palmitic acid of 2.3 g were dissolved in 4720 ml of pure water at 80° C. Then, 540.2 ml of an aqueous 1.4 mol/l NaOH solution were added, and after further adding 6.9 ml of concentrated nitric acid, the mixture was cooled to 55° C. to obtain a fatty acid sodium salt solution. To the thus obtained fatty acid sodium salt solution, 31.7 g of light-sensitive silver halide emulsion A obtained above and 465 ml of water were added and stirred for 5 min., while being maintained at 55° C.

Subsequently, 702.6 ml of a 1M aqueous silver nitrate solution were added in 2 min. and stirred for 20 min. to obtain an organic silver salt dispersion. The resulting dispersion was added with deionized water, allowed to stand to float the organic silver salt to an upper portion, and then, water soluble salts at a lower portion were removed. Thereafter, washing with deionized water and filtration were repeated until the filtrate reached a conductivity of 2 μS/cm. Using a flush jet dryer (produced by Seishin Kigyo Co., Ltd.), the thus obtained cake-like organic silver salt was dried according to the operation condition of a hot air temperature of 75° C. at the inlet of the dryer until reached a moisture content of 0.1% to obtain powdery organic silver salt A. The hot air used was one in which atmospheric air was heated by an electric heater. The moisture content of the thus obtained powdery organic silver salt was measured by an infrared ray aquameter.

Preparation of Pre-dispersion A

Polyvinyl butyral powder (B-79, available from Monsanto Co.) of 14.57 g were dissolved in 1457 g of methyl ethyl ketone (hereinafter referred to as MEK) and 500 g of powdery organic silver salt A were gradually added to obtain pre-dispersion A, while stirring employing a dissolver DISPERMAT Type CA-40M (produced by VMA-GETZMANN Co., Ltd.).

Preparation of Light-sensitive Emulsion A

Thereafter, using a pump, the thus prepared pre-dispersion A was supplied to a media type dispersion machine DISPERMAT Type SL-C12EX (produced by VMA-GETZMANN Co., Ltd.), which was charged with 1 mm Zirconia beads (TORESELAM, available from Toray Co. Ltd.) by 80%, so that the retention time in the mill was 1.5 minutes, and dispersed at a mill circumferential speed of 8 m/s. Thus, light-sensitive emulsion A was obtained.

Stabilizing Solution

Stabilizing agent 1 of 0.9 g and 0.28 g of potassium acetate were dissolved in 10.1 g of methanol to obtain a stabilizing solution.

Infrared Sensitizing Dye Solution

Infrared sensitizing dye 1 of 29 mg, 4.5 g of 2-chlorobenzoic acid, 8.4 g of stabilizing agent 2 and 280 mg of 5-methyl-2-mercaptobenzimidazole were dissolved in 77.2 ml MEK at a dark room to prepare infrared sensitizing dye solution.

Additive Solution (a)

A reducing agent (exemplified compound A-4) of 107 g, 4.8 g of 4-methylphthalic acid and 0.74 g of infrared dye C were dissolved in 261 g of MEK to prepare additive solution (a).

Additive Solution (b-1)

Antifoggant 2 of 11.6 g was dissolved in 137 g of MEK to prepare additive solution (b-1).

Additive Solution (c)

An alkoxysilane compound, $C_6H_5$—NH—$(CH_2)$—Si—$(OCH_3)_3$ of 21.7 g and 45 g of antifoggant 2 were dissolved in 159 g of MEK to prepare additive solution (c).

Preparation of Light-sensitive Layer Coating Solution A

The foregoing light-sensitive emulsion A of 1641 g and 506 g of MEK were maintained at a temperature of 21° C. and 10.75 g of antifoggant 1 (11.2% methanol solution) was added thereto and stirred for 1 hr. Further thereto was added 13.6 g of calcium bromide (11.2% methanol solution) and stirred for 20 min. Subsequently, 11.3 g of stabilizing solution was added thereto and stirred for 10 min., then, 90.5 g of infrared sensitizing dye solution were added and stirred for 1 hr. Thereafter, the temperature was lowered to 13° C. and stirring was continued for 30 min. Polyvinyl butyral, Butvar B-79 (available from Monsanto Co.) of 349.6 g was added and stirred for 30 min., while maintained at 130° C., followed by adding 95 mg of 5-metnyl-2-mercaptobenzimidazole and 3.5 g of tetrachlorophthalic acid and stirring for a period of 30 min. Thereafter were added 1.2 g of 5-nitroindazole, 0.4 g of 5-nitroimidazole, a vinyl compound in an amount as shown in Table 1, 1.0 g of polymethyl methacrylic acid (PARALOID A-21, available from Rohm & Haas Co.), 50 mg of Fluorine-containing surfactant F-1, 50 mg of Fluorine-containing surfactant F-2 ($C_8F_{17}(CH_2CH_2)_{22}C_8F_{17}$), and 224 g of MEK. Subsequently, 148.6 g of additive solution (a), 148.6 g of additive solution (b-1) and 225 g of additive solution (c) were successively added with stirring to obtain light-sensitive layer coating solution A.

subbing layer A-1 of the support at a coating speed of 90 m/min. After 8 sec., the thus coated sample was dried using hot air of a dry bulb temperature of 75° C. and a dew point of 10° C. over a period of 5 min. and wound up on a roll at a tension of 196 N/m (or 20 kg/m) in an atmosphere of 23° C. and 50% RH.

The physical developing nucleus-containing layer coating solution were ejected from slits of an extrusion type die coater and coated on the light sensitive layer, then dried using hot air of a dry bulb temperature of 75° C. and a dew point of 10° C. over a period of 10 min., and wound up on

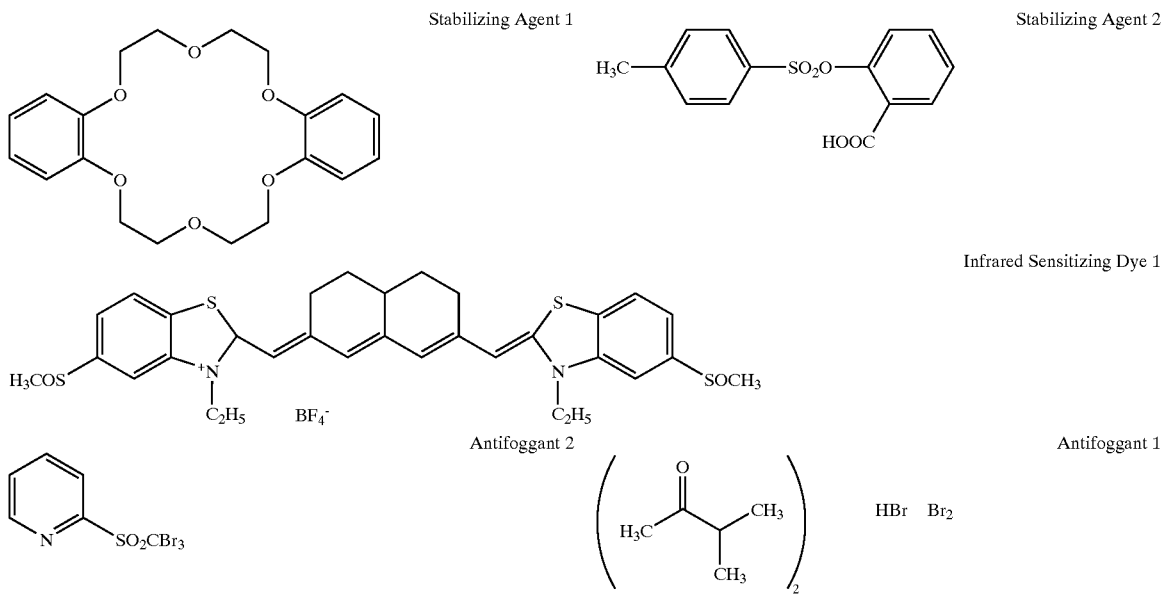

Matting Agent Dispersion

Monodisperse silica particles having an average particle size of 3.5 μm was added to 1.7 g of water to give a silica content of 50 mg/M², and dispersed using a dissolver type homogenizer at 8000 rpm for 30 min. to obtain a dispersion of a matting agent.

Additive Solution (d)

Phthalazine was dissolved in 2.73 g of water to give a phthalazine content of 0.17 g/m² to obtain additive solution (d).

Preparation of Physical Developing Nucleus Containing Layer Coating Solution

To 15.9 g per m² of water were added 0.2 g of palladium sulfide physical developing nucleus, which was prepared according to a preparation method of a physical developing nucleus A as disclosed in Japanese Patent O.P.I. Publication No. 56-27151, 1.8 g of polyvinyl alcohol, 50 mg of fluorinated surfactant F-2 ($C_8F_{17}(CH_2CH_2O)_{22}C8F_{17}$) and 2.73 g of additive solution (d) in that order. Subsequently, 1.75 g of matting agent dispersion was further added thereto with stirring to obtain a physical developing nucleus containing layer coating solution.

Light-sensitive Layer Side Coating

Viscosities of the anti-halation layer coating solution 1 and the foregoing light-sensitive layer coating solution A were each adjusted to 0.228 and 0.184 Pa·s, respectively, by adjusting the solvent amount. After filtering by allowing to pass through a filter having a semi-absolute filtration accuracy of 20 μm, the coating solutions were ejected from slits of an extrusion type die coater and simultaneously coated on a roll at a tension of 196 N/m (or 20 kg/m) in an atmosphere of 23° C. and 50% RH to obtain planographic printing plate material samples 101 through 106. The resulting planographic printing plate material samples had a silver coating amount of 1.5 g/M² and a physical developing nucleus-containing layer with a dry thickness of 2.5 μm.

Preparation of Planographic Printing Plate

Each of the resulting material samples was allowed to stand at 40° C. and 48% RH for 48 hours.

Latent Image Forming Process

Exposure was carried out employing a laser exposure apparatus emitting a 780 nm longitudinal multiple mode beam with a resolution of 4000 dpi (dpi represents a dot number per inch or 2.54 cm), and having a cylindrical drum for mounting a planographic printing plate material on the outer circumferential surface. Dot images with 3, 5, 10, 50, 90, 95 and 97% dot areas at a screen line number of 175, a solid image, and line/space images of a resolution of 500, 1000, 2000, and 4000 dpi in each of the main scanning, sub scanning, and oblique scanning directions were recorded from the light sensitive layer side. Exposure amount was changed from 0.1 to 1.0 mj/cm² at an interval of 0.1 mj/cm², and optimum exposure condition was determined in each of planographic printing plate materials. Printing performance of planographic printing plate material, which was exposed under optimum condition, was evaluated.

Thermal Development Process

The planographic printing plate material sample, after latent image formation, was thermally developed at 120° C. for 15 seconds employing a thermal developing machine DRYPRO 722 produced by Konica Corporation. In the invention, silver with a mirror surface was crystallized on the surface of the non-image portions. The resulting material sample was further heated at 130° C. for 10 seconds.

Printing

A printing press, DAIYA 1F-1 produced by Mitsubishi Jukogyo Co., Ltd., was employed. Printing was carried out employing a coated paper, dampening water (H solution SG-51 with a concentration of 1.5%, produced by Tokyo Ink Co., Ltd.), and ink Toyo King High Eco M (magenta), produced by Toyo Ink Co., Ltd. An ink supply roller was brought into contact with the plate cylinder and dampening water was supplied to the printing plate for 10 seconds while the plate cylinder was rotated, and then, printing was ordinarily carried out.

Evaluation of Printing Performance

Stains at the non-image portions, images with a 2000 dpi line/space and images with a 3% dot area were observed, and evaluated, based on the ranking of 1 to 5. The most excellent printing performance was rated as "5", and as the printing performance was lowered, rank was lowered to 4, 3, 2 and 1. A sample providing a rank of not more than 2 was judged as impracticable.

The results are shown in Table 1.

TABLE 1

| | Contrast-increasing agent | | | |
|---|---|---|---|---|
| Sample No. | Chemical structure | Addition amount (mol/mol of organic silver) | Printing performance | Remarks |
| 101 | None | None | 1 | Comp. |
| 102 | 35-3 | $1 \times 10^{-6}$ | 5 | Inv. |
| 103 | 68-1 | $1 \times 10^{-6}$ | 5 | Inv. |
| 104 | 72-17 | $1 \times 10^{-6}$ | 5 | Inv. |
| 105 | 72-15 | $1 \times 10^{-6}$ | 5 | Inv. |
| 106 | 91-4 | $1 \times 10^{-6}$ | 5 | Inv. |

Comp.: Comparative, Inv.: Invention

As is apparent from Table 1 above, the inventive samples provide superior prints as compared to the comparative sample.

Example 2

Planographic printing plate material samples 202 through 206 were prepared in the same manner as in Example 1, except that the hydrazine derivatives in an amount as shown in Table 2 were used instead of the vinyl compounds used as a contrast increasing agent in the light sensitive coating solution A, and evaluated in the same manner as in Example 1. The results are shown in Table 2.

TABLE 2

| | Contrast-increasing agent | | | |
|---|---|---|---|---|
| Sample No. | Chemical structure | Addition amount (mol/mol of organic silver) | Printing performance | Remarks |
| 101 | None | None | 1 | Comp. |
| 202 | H-1-8 | $2 \times 10^{-5}$ | 4 | Inv. |
| 203 | H-2-1 | $2 \times 10^{-5}$ | 4 | Inv. |
| 204 | H-3-4 | $2 \times 10^{-5}$ | 4 | Inv. |
| 205 | H-3-10 | $2 \times 10^{-5}$ | 4 | Inv. |
| 206 | H-4-1 | $2 \times 10^{-5}$ | 4 | Inv. |

Comp.: Comparative, Inv.: Invention

As is apparent from Table 2 above, the inventive samples provide superior prints as compared to the comparative sample.

Example 3

Planographic printing plate material samples 301 through 306 were prepared in the same manner as in Example 1, except that a PET/Al composite support prepared as described below was used, and the vinyl compounds in an amount as shown in Table 3 were used instead of the vinyl compounds used as a contrast increasing agent in the light sensitive coating solution A.

(Preparation of PET/Al Composite Support)

On each side of a 0.05 mm thick PET film was formed the same subbing layer as one formed on the PET support described above. The surface of a degreased 0.2 mm thick aluminum (1050 material) plate was coated with an adhesive of polyurethane type to have an adhesive layer with a thickness of 3 g/m², and the PET film prepared above was laminated on the adhesive layer. The resulting laminate was aged at 60° C. for 24 hours. Thus, a PET/Al composite support was obtained.

Planographic printing plate samples were prepared, and evaluated in the same manner as in Example 1. The results are shown in Table 3.

TABLE 3

| | Contrast-increasing agent | | | |
|---|---|---|---|---|
| Sample No. | Chemical structure | Addition amount (mol/mol of organic silver) | Printing performance | Remarks |
| 301 | None | None | 1 | Comp. |
| 302 | 33-3 | $1 \times 10^{-6}$ | 5 | Inv. |
| 303 | 67-3 | $1 \times 10^{-6}$ | 5 | Inv. |
| 304 | 72-13 | $1 \times 10^{-6}$ | 5 | Inv. |
| 305 | 72-15 | $1 \times 10^{-6}$ | 5 | Inv. |
| 306 | 91-4 | $1 \times 10^{-6}$ | 5 | Inv. |

Comp.: Comparative, Inv.: Invention

As is apparent from Table 3 above, the inventive samples provide superior prints as compared to the comparative sample.

Example 4

(Preparation of Aluminum Support)
(Preparation of a Support)

A 0.24 mm thick aluminum plate (material 1050) was degreased at 50° C. for 30 seconds in a 2% by weight sodium hydroxide solution, washed with water, and then anodized at 25° C. at a voltage of 20V in a 20% by weight sulfuric acid solution to form an anodization film of a thickness of 0.5 G/m². The resulting aluminum plate was washed with water, immersed at 70° C. for 30 seconds in a 2% by weight sodium silicate solution, washed with water, and dried. Thus, an aluminum support was obtained.

(Preparation of Light Sensitive Layer)

Antihalation Layer Coating Solution 2

Antihalation layer coating solution 2 was prepared which comprised of the following composition.

| | |
|---|---|
| Polyvinyl alcohol | 30 g |
| Dye-C | 5 g |
| Water | 250 g |
| Sildex H121 (spherical silica particles with an average diameter of 12 μm, produced by Dokai Kagaku Co., Ltd.) | 1.8 g |

Preparation of Light Sensitive Silver Halide Emulsion C

In 700 ml of water were dissolved 22 g of phthalated gelatin and 30 mg of potassium bromide. After adjusting the temperature and the pH to 40° C. and 5.0, respectively, 159 ml of an aqueous solution containing 18.6 g silver nitrate and 159 ml of an aqueous potassium chloride solution were added by the controlled double jet addition in 10 min, while pAg was maintained at 7.5. Then, 476 ml of an aqueous silver nitrate solution containing 55.4 g silver nitrate and an aqueous solution containing $8 \times 10^{-6}$ mol/l of $K_3[IrCl_6]^{3-}$ and 1 mol/l of potassium bromide were added by the double jet addition in 30 min, while pAg was maintained at 7.7. Thereafter, the pH and pAg were adjusted to 5.9 and 8.0, respectively. There were obtained monodisperse, cubic silver bromochloride grains (having a chloride content of 50 mol %) having an average grain size of 0.07 μm, a dispersity of 15%, and the proportion of the {100} face of 85%.

The thus obtained silver halide grain emulsion was heated to 60° C., added with $8.5 \times 10^{-5}$ mol of sodium thiosulfate, $1.1 \times 10^{-5}$ mol of 2,3,4,5,6-pentafluorophenyldiphenylphosphine selenide, $1 \times 10^{-6}$ mol of tellurium compound-1 and $3.3 \times 10^{-6}$ mol of chloroauric acid and $2.3 \times 10^{-4}$ mol thiocyanic acid, each per mol of silver, and ripened for 120 minutes. Thereafter, the temperature was lowered to 50°C, then, $8 \times 10^{-4}$ mol/mol Ag of sensitizing dye C was added thereto with stirring. Subsequently was added thereto potassium iodide of $3.5 \times 10^{-2}$ mol, based on silver and after stirring for 30 min., the emulsion was cooled to 30° C. to obtain light sensitive silver halide emulsion C.

Preparation of Microcrystalline Organic Silver Salt Dispersion C

Behenic acid of 40 g, stearic acid of 7.3 g were stirred with 500 ml water at 90° C. for 15 min. and 187 ml of an aqueous 1M sodium hydroxide solution was added thereto in 15 min., then, 61 ml of an aqueous 1M silver nitrate solution was further added, and the temperature was lowered to 50° C. Subsequently, 124 ml of an aqueous 1M silver nitrate solution was added thereto and further stirred for 30 min. The solid product was filtered using a suction funnel and then subjected to water washing until the conductivity of the filtrate reached 30 μS/cm. The thus obtained solid was treated in a wet cake form, without being dried. To the wet cake equivalent to 34.8 g of dried solid, 120 g of polyvinyl alcohol and 150 ml water were added with stirring to form slurry. The slurry was added into a vessel together with 840 g of zirconia beads having an average diameter of 0.5 mm and dispersed for 4 hrs. through a dispersing machine (¼ Sand Grinder Mill, available from IMEX Co. Ltd.) to obtain an microcrystalline organic silver salt dispersion, which was comprised of monodisperse organic silver salt dispersion C comprising silver salt particles with a volume-averaged size of 1.2 μm and a dispersity of 20%.

The particle size was measured using Master Saizer X, available from Malvern Instrument Co., Ltd. To the above obtained dispersion were added 3 ml of a 6% phenylbromide perbromide methanol solution.

Preparation of Solid Particle Dispersion of Materials

A solid particle dispersion of tetrachlorophthalic acid, 4-methylphthalic acid, 1,1-bis(2-hydroxy-3,5-dimethylphenyl)-3,5,5-trimethylhexane, phthalazine or tribromomethylsulfonylbenzene was prepared according to the following method.

Thus, to 5.4 g of tetrachlorophthalic acid were added 0.81 g f hydroxypropylcellulose and 94.2 ml water with stirring and was allowed to stand in the form of a slurry for 10 hrs. Thereafter, 100 ml of zirconia beads having an average diameter of 0.5 mm was added together with the slurry to the vessel and dispersed in 5 hrs. the same type dispersing apparatus as used in the preparation of the silver salt microcrystal dispersion C to obtain a tetrachlorophthalic acid microcrytal dispersion, in which 70 wt % of the fine solid particles exhibited a size of 1.0 μm or less. With regard to other materials, solid particle dispersions were obtained in a similar manner, provided that the amount of a dispersant and the dispersing time were optimally varied to obtain an intended average particle size.

Light Sensitive Layer Coating Solution C

To the thus prepared organic silver salt microcrystal dispersion were added the following additives to prepare a light sensitive layer coating solution C.

| | |
|---|---|
| Organic silver salt microcrystalline dispersion C | 1 mole |
| Light sensitive silver halide emulsion C | 0.05 mole |
| Binder: SBR latex (LACSTAR 3307B available from DAINIPPON INK Co., Ltd) | 430 g |
| Tetrachlorophthalic acid | 5 g |
| 1,1-Bis(2-hydroxy-3,5-dimethylphenyl)-3,5,5-trimethylhexane | 98 g |
| Phthalazine | 9.0 g |
| Polyhalide: Tribromomethylphenylsulfone | 12 g |
| 4-Methylphthalic acid | 7 g |
| Vinyl compound | Amount shown in Table 4 |
| Hydrazine derivative | Amount shown in Table 4 |

Preparation of Surface Protective Layer Coating Solution

Surface Protective Layer Coating Solution was prepared which had the following composition.

| | |
|---|---|
| Inert gelatin | 10 g |
| Surfactant A | 0.26 g |
| Surfactant B | 0.09 g |
| Fine silica particles (av. size 2.5 μm) | 0.9 g |
| Colloidal silica | 0.5 g |
| 1,2-(Bisvinylsulfonacetamido)ethane | 0.5 g |
| Water | 64 g |

Tellurium Compound-1

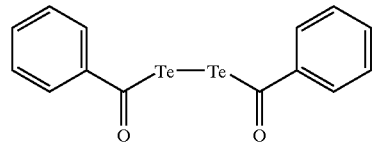

-continued

Sensitizing Dye C

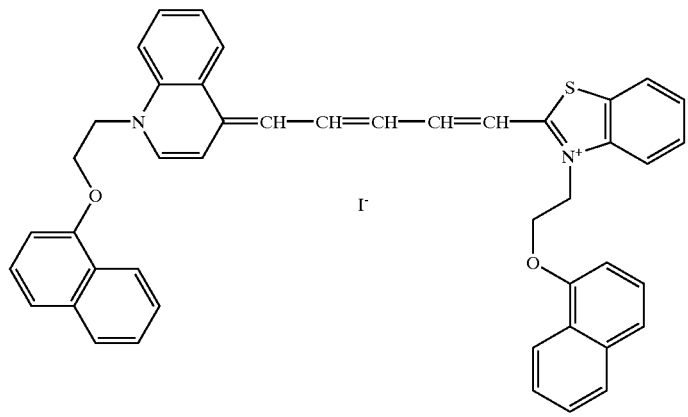

Surfactant A

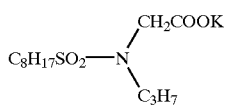

Surfactant B

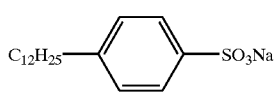

Dye-C

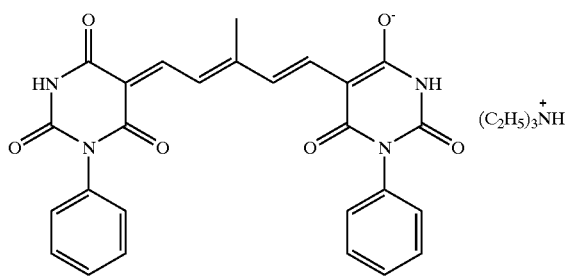

On the aluminum support obtained above were coated the antihalation layer coating solution 2, the physical developing nucleus-containing layer coating solution, the light sensitive layer coating solution C, and the surface protective layer coating solution in that order so as to have a silver coverage of 1.6 g/m² and so as to have a gelatin coating amount of 1.8 g/m² in the surface protective layer. Before coating, each coating solution was filtered using a filter of a semi-absolute filtration accuracy of 20 μm, except for the physical developing nucleus-containing layer coating solution. Thus, a planographic printing plate material sample was obtained.

The resulting sample was allowed to stand at 50° C. and 60% RG for 24 hours. A planographic printing plate was prepared in the same manner as in Example 1, except that the thermal development process was changed to that described below. The results are shown in Table 4.

Thermal Development Process

The planographic printing plate material sample, after latent image formation, was thermally developed at 120° C. for 20 seconds employing a thermal developing machine Dry View Processor 2771 produced by Kodak Polychrom Graphics Co., Ltd., which had been modified to be capable of changing a thermal development temperature. The resulting material sample was further heated at 130° C. for 10 seconds. The Dry View Processor 2771 was an automatic thermal developing machine of plane-transport type having a preheating section.

Subsequently, the light sensitive layer and surface protective layer of the resulting sample were removed with water to expose a silver film to obtain a planographic printing plate. Employing this printing plate, printing was carried out in the same manner as in Example 1.

TABLE 4

| Sample No. | Contrast-increasing agent Chemical structure | Addition amount (mol/mol of organic silver) | Printing performance | Remarks |
|---|---|---|---|---|
| 401 | None | None | 1 | Comp. |
| 402 | 33-1 | $1 \times 10^{-6}$ | 5 | Inv. |
|  | H-1-8 | $1 \times 10^{-5}$ |  |  |
| 403 | 67-3 | $1 \times 10^{-6}$ | 5 | Inv. |
|  | H-2-1 | $1 \times 10^{-5}$ |  |  |
| 404 | 72-13 | $1 \times 10^{-6}$ | 5 | Inv. |
|  | H-4-1 | $1 \times 10^{-5}$ |  |  |
| 405 | 72-15 | $1 \times 10^{-6}$ | 5 | Inv. |
|  | H-3-10 | $1 \times 10^{-5}$ |  |  |
| 406 | 91-4 | $1 \times 10^{-6}$ | 5 | Inv. |
|  | H-3-4 | $1 \times 10^{-5}$ |  |  |

Comp.: Comparative, Inv.: Invention

As is apparent from Table 4 above, the inventive samples provide superior prints as compared to the comparative sample.

Example 5

Samples 401 and 402 prepared in Example 4 were exposed and thermally developed in the same manner as in Example 1 to obtain printing plates, except that an automatic thermal developing machine as shown in FIG. 1 was employed.

FIG. 1 shows an automatic thermal developing machine 18 provided with a plate heater 120 comprised of a flocked stainless steel plate as a heating body heated to a temperature necessary to process a planographic printing plate material sheet A (hereinafter referred to also as sheet A), a pair of feed rollers 126 for moving (or sliding) the sheet A relative to the plate heater 120, while the sheet is brought into contact with the plate heater 120, and pressing rollers 122 as a means for pressing the surface side of the sheet A opposite the surface in contact with the plate heater 120. The plate heater is a planar plate heater. Thus, the plate heater 120 is a planar heating member to maintain the sheet A at a developing temperature, in which nichrome wires are internally installed in a planar form. The sheet A, after exposed, is introduced to an automatic thermal developing machine 18 via a pair of feed rollers 126 driven by a driving apparatus; then, the sheet A is allowed to pass through between the pressing rollers 122 of silicone rubber and plate heater 120 by a pair of feed rollers 126 to be thermally developed. The thermally developed sheet A is discharged through a pair of discharge rollers 128. To prevent abrasion marks, the backside of the sheet A is brought into contact with the plate heater 120. The pressing rollers 122 are brought into contact with one side of the plate heater 120 and arranged at a given pitch over a whole length of the plate heater 120 in the transporting direction, with spacing of less than the sheet thickness to form a sheet transport route 124 between the pressing rollers 122 and plate heater 120. On the both ends of the sheet transport route 124, a pair of feed rollers 126 and a pair of discharge rollers 128 are arranged as means for transporting the sheet A. These are covered with a heat-insulating cover 125.

The resulting printing plate samples 501 and 502 were evaluated for printing performance in the same manner as in Example 1. The results are shown in Table 5.

TABLE 5

| Plate sample No. | Sample No. | Contrast-increasing agent Chemical structure | Addition amount (mol/mol of organic silver) | Printing performance | Remarks |
|---|---|---|---|---|---|
| 501 | 401 | None | None | 1 | Comp. |
| 502 | 405 | 72-15 | $1 \times 10^{-6}$ | 5 | Inv. |
|  |  | H-3-10 | $1 \times 10^{-5}$ |  |  |

Comp.: Comparative, Inv.: Invention

As is apparent from Table 5 above, the inventive sample provides superior prints as compared to the comparative sample.

[Effect of the Invention]

The present invention can provide a planographic printing plate material employing a thermal development process and providing an excellent printing performance and a method of preparing a printing plate therefrom.

What is claimed is:

1. A planographic printing plate material comprising a support and provided thereon, one or more structural layers containing light sensitive silver halide grains, organic silver salt grain , a reducing agent, a contrast-increasing agent and a physical developing nucleus, wherein the contrast-increasing agent is hydrazine derivative or a vinyl compound represented by the following formula (G):

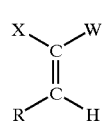

formula (G)

wherein X represents an electron withdrawing group; W represents a hydrogen atom, an alkyl group, an alkenyl group, an alkynyl group, an aryl group, a heterocyclic group, a halogen atom, an acyl group, a thioacyl group, an oxalyl group, an oxyoxalyl group, a thiooxalyl group, an oxamoyl group, an oxycarbonyl group, a thiocarbonyl group, a carbamoyl group, a thiocarbamoyl group, a sulfonyl group, a sulfinyl group, an oxysulfonyl group, a thiosulfonyl group, a sulfamoyl group, an oxysulfinyl group, a thiosulfinyl group, a sulfinamoyl group, a phosphoryl group, a nitro group, an imino group, an N-carbonylimino group, an N-sulfonylimino group, a dicyanoethyl group, an ammonium group, a sulfonium group, a phosphonium group, a pyrylium group, or an immonium group; and R represents halogen atom, a hydroxyl group, an alkoxy group, an aryloxy group, a heterocyclic-oxy group, an alkenyloxy group, an acyloxy group, an alkoxycarbonyloxy group, an aminocarbonyloxy group, a mercapto group, an alkylthio group, a arylthio group, a heterocyclic-thio group, an alkenylthio group, an acylthio group, an alkoxycarbonylthio group, an aminocarbonylthio group, an organic or inorganic salt group of a hydroxyl or mercapto group, an amino group, an alkylamino group, a cyclic amino group, an acylamino group, an oxycarbonylamino group, a heterocyclic group, a ureido group, or a sulfonamido group.

2. The planographic printing plate material of claim 1, wherein the average grain size of the light sensitive silver halide grains is in the range of from 0.01 to 0.1 μm.

3. The planographic printing plate material of claim 1, wherein one of the structural layers contains light sensitive silver halide grains, organic silver salt grains, a reducing agent, a contrast-increasing agent and a physical developing nucleus.

4. The planographic printing plate material of claim 1, wherein the structural layers comprise a physical developing nucleus layer containing the physical developing nucleus, and a light sensitive silver halide layer containing the light sensitive silver halide grains.

5. The planographic printing plate material of claim 4, wherein the physical developing nucleus layer is provided on the light sensitive silver halide layer.

6. The planographic printing plate material of claim 4, wherein the physical developing nucleus layer is provided between the support and the light sensitive silver halide layer.

* * * * *